(12) United States Patent
Yoneda et al.

(10) Patent No.: US 11,531,208 B2
(45) Date of Patent: Dec. 20, 2022

(54) LIGHT SOURCE, OPTICAL DEVICE, MEASURING DEVICE, ROBOT, ELECTRONIC APPARATUS, MOVABLE STRUCTURE, AND MANUFACTURING APPARATUS

(71) Applicant: Ricoh Company, Ltd., Tokyo (JP)

(72) Inventors: Kazuhiro Yoneda, Osaka (JP); Yoshihiko Miki, Kyoto (JP); Naoki Fukuoka, Osaka (JP)

(73) Assignee: RICOH COMPANY, LTD., Tokyo (JP)

( * ) Notice: Subject to any disclaimer, the term of this patent is extended or adjusted under 35 U.S.C. 154(b) by 427 days.

(21) Appl. No.: 16/693,429

(22) Filed: Nov. 25, 2019

(65) Prior Publication Data

US 2020/0166768 A1 May 28, 2020

(30) Foreign Application Priority Data

Nov. 27, 2018 (JP) .............................. JP2018-221697
Oct. 3, 2019 (JP) .............................. JP2019-183166

(51) Int. Cl.
| | | |
|---|---|---|
| G02B 27/48 | (2006.01) |
| H01S 5/0687 | (2006.01) |
| G01J 1/42 | (2006.01) |
| B25J 19/02 | (2006.01) |
| B33Y 50/00 | (2015.01) |
| B29C 64/386 | (2017.01) |
| H01S 5/42 | (2006.01) |
| H01S 5/02325 | (2021.01) |
| H01L 33/08 | (2010.01) |
| H01L 27/15 | (2006.01) |
| G06V 10/141 | (2022.01) |
| G06V 10/145 | (2022.01) |

(Continued)

(52) U.S. Cl.
CPC ............ *G02B 27/48* (2013.01); *B25J 19/021* (2013.01); *B29C 64/386* (2017.08); *B33Y 50/00* (2014.12); *G01J 1/4257* (2013.01); *G06V 10/141* (2022.01); *G06V 10/145* (2022.01); *G06V 40/16* (2022.01); *H01L 27/15* (2013.01); *H01L 33/08* (2013.01); *H01S 5/02325* (2021.01); *H01S 5/0687* (2013.01); *H01S 5/423* (2013.01); *B60R 25/30* (2013.01); *G02B 5/09* (2013.01); *G02B 26/0833* (2013.01); *G05D 1/0231* (2013.01)

(58) Field of Classification Search
CPC .................................................. H01S 5/06236
USPC ........................................................ 372/109
See application file for complete search history.

(56) References Cited

U.S. PATENT DOCUMENTS

| | | | | |
|---|---|---|---|---|
| 7,020,400 B2 * | 3/2006 | Trezza | ...................... | G02B 6/43 |
| | | | | 398/164 |
| 2002/0195496 A1 * | 12/2002 | Tsikos | .................... | B82Y 15/00 |
| | | | | 235/462.01 |

(Continued)

FOREIGN PATENT DOCUMENTS

| | | |
|---|---|---|
| JP | 2008-244101 | 10/2008 |
| JP | 2017-117891 | 6/2017 |

*Primary Examiner* — Tuan N Nguyen
(74) *Attorney, Agent, or Firm* — Xsensus LLP

(57) ABSTRACT

According to one embodiment, a light source includes a plurality of light-emitting elements each including one or more surface-emitting lasers; and a plurality of detecting elements located on a same substrate as the light-emitting elements. The detecting elements individually detect quantities of output light of the light-emitting elements.

15 Claims, 29 Drawing Sheets

(51) Int. Cl.
  G05D 1/02    (2020.01)
  G02B 26/08   (2006.01)
  G06V 40/16   (2022.01)
  G02B 5/09        (2006.01)
  B60R 25/30       (2013.01)

(56) References Cited

U.S. PATENT DOCUMENTS

2008/0240185 A1     10/2008  Sai
2009/0016390 A1*    1/2009   Sumiyama ........... G03B 21/208
                                                       372/29.01
2017/0179682 A1     6/2017   Ishii et al.

* cited by examiner

FIG.10
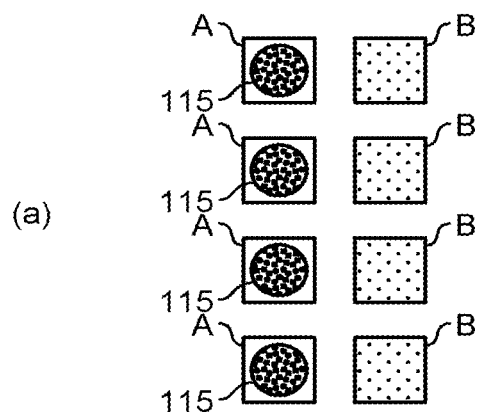
(a)
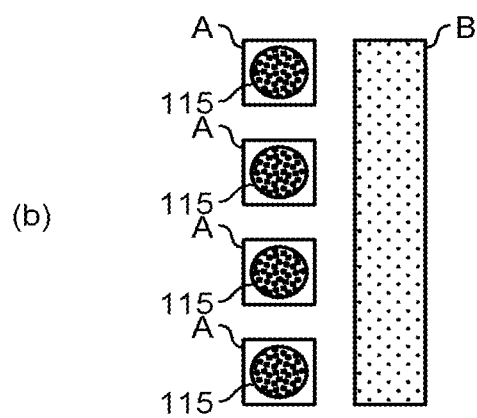
(b)
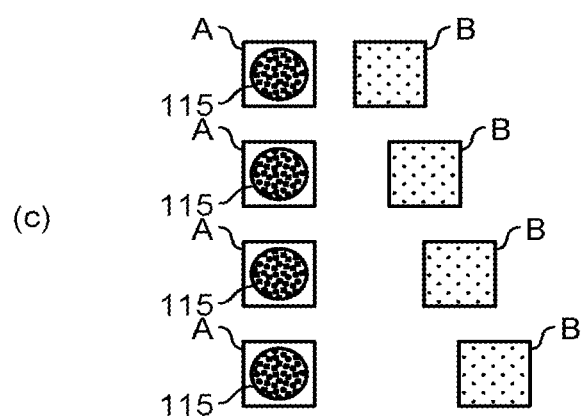
(c)

FIG.11
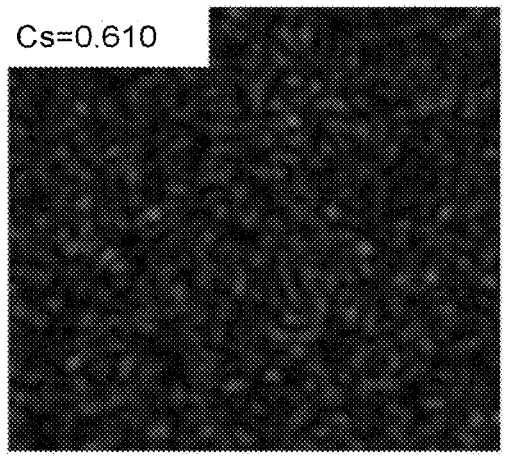
(a) LIGHT SOURCE 1
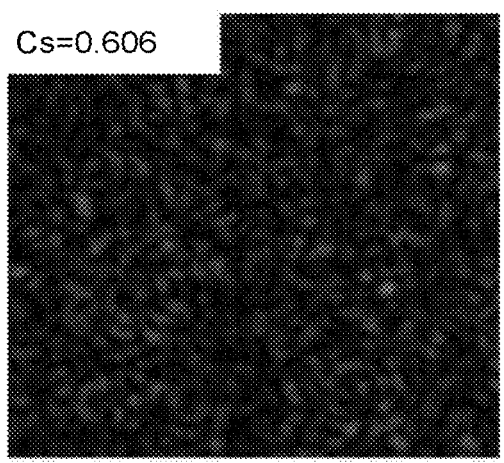
(b) LIGHT SOURCE 2
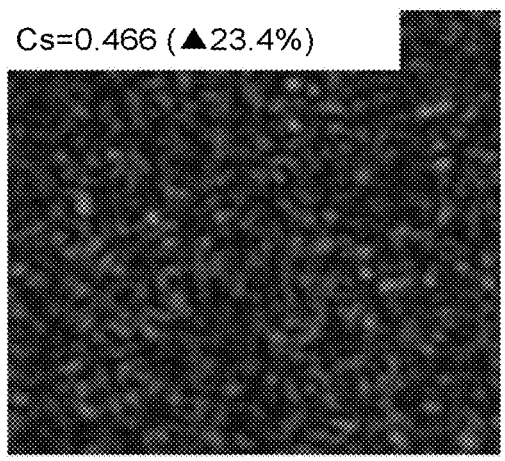
(c) COMBINED IMAGE

FIG.12
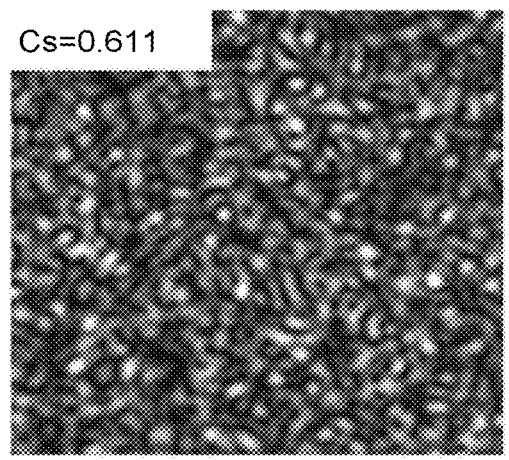
(a) LIGHT SOURCE 1_High
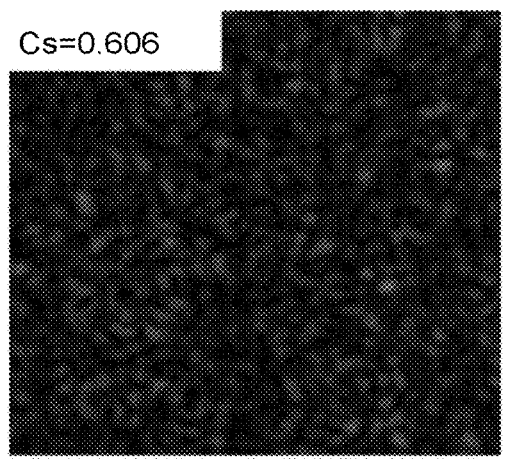
(b) LIGHT SOURCE 2
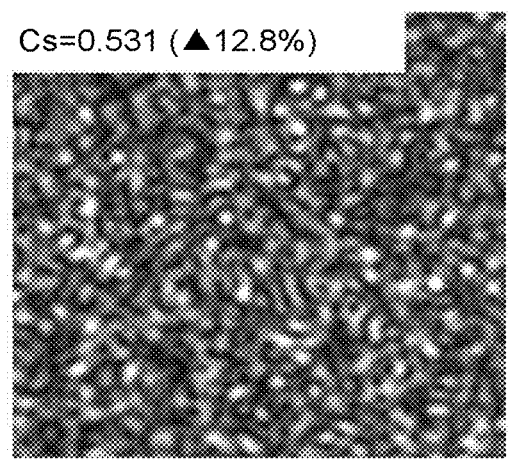
(c) COMBINED IMAGE

LIGHT SOURCE, OPTICAL DEVICE, MEASURING DEVICE, ROBOT, ELECTRONIC APPARATUS, MOVABLE STRUCTURE, AND MANUFACTURING APPARATUS

CROSS-REFERENCE TO RELATED APPLICATIONS

The present application claims priority under 35 U.S.C. § 119 to Japanese Patent Application No. 2018-221697, filed on Nov. 27, 2018 and Japanese Patent Application No. 2019-183166, filed on Oct. 3, 2019. The contents of which are incorporated herein by reference in their entirety.

BACKGROUND OF THE INVENTION

1. Field of the Invention

The present invention relates to a light source, an optical device, a measuring device, a robot, an electronic apparatus, a movable structure, and a manufacturing apparatus.

2. Description of the Related Art

Laser light have characteristic property such as coherence that causes flickering or noise in a spotted pattern called speckles on an observed face (for example, eye retina, image sensor of camera) due to diffraction of scattering light on an irradiated surface. Speckles are considered as a disadvantage in terms of laser usage since they adversely affect image quality and measurement accuracy. Research has been advanced to solve such a disadvantage.

To reduce speckles, as one example, one available method is to use a vertical cavity surface emitting laser (VCSEL) including a plurality of light sources in one chip to emit light. By emitting light from the multiple light sources, the speckle patterns caused by the light sources can be averaged or superimposed to reduce noise. As another example, a light source module includes a surface emitting laser being part of an additively manufactured structure including an active layer, and an optical detecting element being another part of the additively manufactured structure and optically connected to the surface-emitting laser element, to irradiate a subject with light (see Japanese Unexamined Patent Application Publication No. 2017-117891, for example).

Noise reduction effect by averaging is based on the premise that the speckle patterns formed by the light sources are the same in terms of average brightness. VCSEL chips include manufacturing error, differ in wavelength among the light sources, have characteristic drift due to self-heating, and degrade over time, therefore, the light sources may not stably output light and differ in average brightness even if the light sources are driven under the same condition.

SUMMARY OF THE INVENTION

According to one aspect of the present invention, a light source includes a plurality of light-emitting elements each including one or more surface-emitting lasers; and a plurality of detecting elements located on a same substrate as the light-emitting elements. The detecting elements individually detect quantities of output light of the light-emitting elements.

BRIEF DESCRIPTION OF THE DRAWINGS

FIG. 10 is a diagram illustrating an example of combination and arrangement of monitor elements;

FIG. 11 is a diagram illustrating exemplary speckle images actually generated under the same photographic condition;

FIG. 12 is a diagram illustrating exemplary speckle images actually generated under a different photographic condition;

The accompanying drawings are intended to depict exemplary embodiments of the present invention and should not be interpreted to limit the scope thereof. Identical or similar reference numerals designate identical or similar components throughout the various drawings.

DESCRIPTION OF THE EMBODIMENTS

Figure 1:
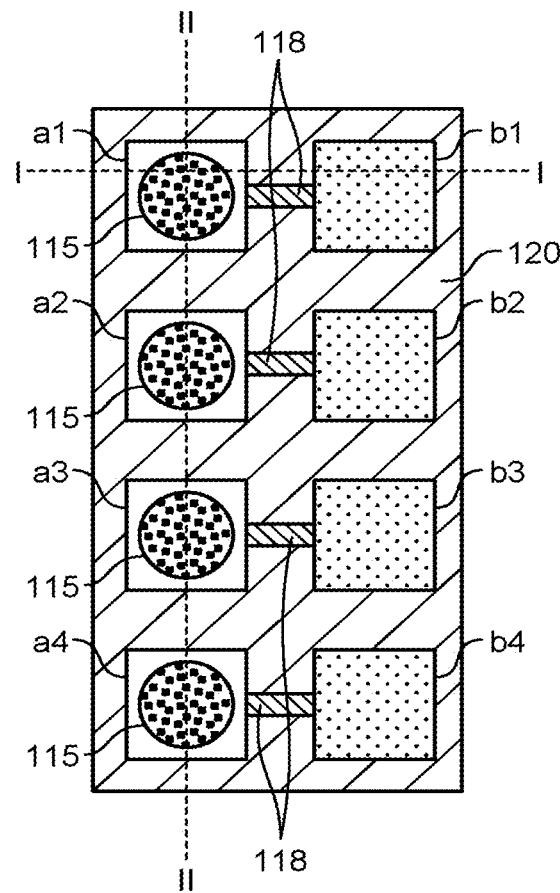
FIG. 1 is a diagram illustrating an example of arrangement of light-emitting elements and monitor elements of a vertical cavity surface emitting laser according to an embodiment.

The terminology used herein is for the purpose of describing particular embodiments only and is not intended to be limiting of the present invention.

As used herein, the singular forms "a", "an" and "the" are intended to include the plural forms as well, unless the context clearly indicates otherwise.

In describing preferred embodiments illustrated in the drawings, specific terminology may be employed for the sake of better understanding. However, the disclosure of this patent specification is not intended to be limited to the specific terminology so selected, and it is to be understood that each specific element includes all technical equivalents that have the same function, operate in a similar manner, and achieve a similar result.

An embodiment of the present invention will be described in detail below with reference to the drawings.

An object of an embodiment is to provide a light source, an optical device, a measuring device, a robot, an electronic apparatus, a movable structure, and a manufacturing apparatus which can reduce difference in average brightness of speckle patterns.

Embodiments of a light source, an optical device, a measuring device, a robot, electronic apparatus, a movable structure, and a manufacturing apparatus will be described below with reference to the accompanying drawings. The following embodiments are not intended to limit the scope of the present invention.

First Embodiment

In a vertical cavity surface emitting laser (VCSEL), let Si be the average brightness of a speckle pattern formed by each light-emitting source, of be standard deviation, and Csi be speckle contrast. When each light-emitting source emits laser at the same power, $S1=S2=S3=\ldots=S0$ and $\sigma 1=\sigma 2=\sigma 3=\ldots=\sigma 0$ can hold true. In combining n speckle pattern images, the combined image (superimposed image) has a brightness value of $S1+S2+\ldots+Sn=S0\times n$.

For variability, the additivity of variances holds, that is, $\sigma^2=\sigma_1^2+\sigma_2^2+\ldots+\sigma_n^2$ and $\sigma=\sqrt{(n\times\sigma_0^2)}=\sigma_0\sqrt{n}$.

The speckle contrast Csn of a composite image of n images is represented by the following equation:

$$Csn=\sigma\sqrt{n}/(S\times n)=(\sqrt{n}/n)\times(\sigma 0/S0)=1/\sqrt{n}\times Cs0.$$

That is, the speckle contrast can be improved to $1/\sqrt{n}$ by combining n speckle pattern images.

As an example, suppose that two light sources (first light-emitting source and second light-emitting source) are used to emit laser with different degrees of power. In this case, for example, it is assumed that $S_1=S_0$ and $\sigma_1=\sigma_0$ for the first light-emitting source holds, and $S_2=10S_0$ and $\sigma_2=10\sigma_0$ for the second light-emitting source holds. In this case, the speckle contrast $C_s$ of the composite image when the initial speckle contrast is defined as $Cs_0=\sigma_0/S_0$ is calculated by the following equation:

$$C_s=\sqrt{(\sigma_1^2+\sigma_2^2)}/(S_1+S_2)=\sqrt{(101\sigma_0^2)}/11S_0=(\sqrt{101}/11)$$
$$Cs_0\approx 0.91Cs_0.$$

That is, the expected reduction effect of $1/\sqrt{n}$ (in this case, n=2) is not attainable as long as the light sources emit emission laser with different degrees of power. VCSEL chips typically suffer from manufacturing error, difference in wavelength among light sources, characteristic drift due to self-heating, degradation overtime, and else. In other words, the above results signify that the average brightness will differ unless the light sources stably output light, and the expected noise reduction effect by averaging is not attainable.

In view of the results above, the following will describe an embodiment of a vertical cavity surface emitting laser (VCSEL) that can stabilize the output of light sources. To this end, the light sources are simultaneously turned on to combine speckle patterns. In this case, it is not practical to detect, with a photodiode, light emitted from the light sources individually turned on to perform feedback control. It is preferable to perform feedback control in real time to deal with simultaneous turning-on of the light sources. Herein, a VCSEL chip capable of real-time feedback control is illustrated as an exemplary embodiment.

Figure 2:
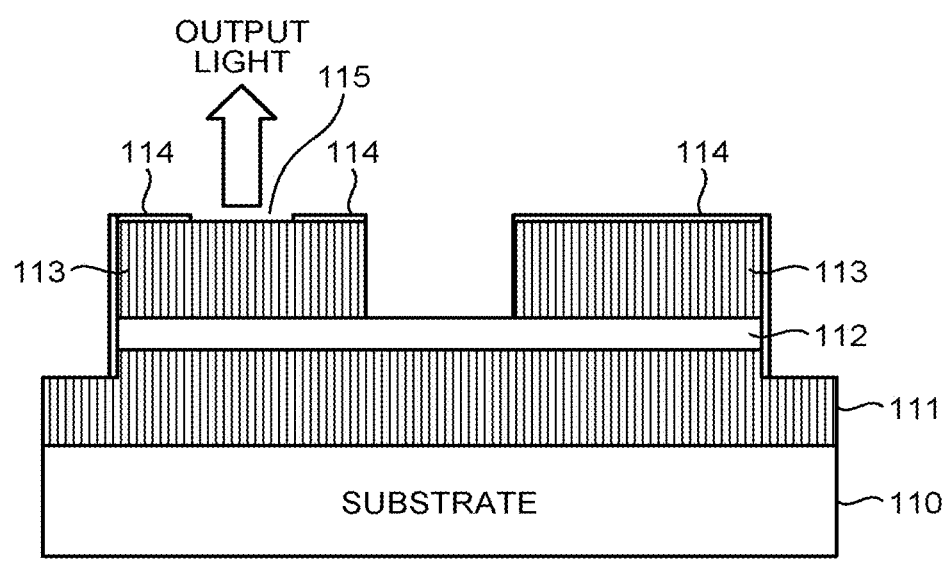
FIG. 2 is a cross-sectional view illustrating a configuration of light-emitting elements and monitor elements along line I to I.

FIG. 1 and FIG. 2 are exemplary configuration diagrams of a vertical cavity surface emitting laser (VCSEL) according to the present embodiment. FIG. 1 illustrates an exemplary arrangement of light-emitting elements and monitor elements (detecting elements) on a VCSEL chip. An opening 115 of each of the light-emitting elements a1 to a4 illustrated in FIG. 1 corresponds to a light-emitting source to emit a light beam. Hereinafter, the light-emitting elements a1 to a4 are denoted as light-emitting elements A unless otherwise distinguished from each other. In FIG. 1, the light-emitting elements A are arranged on a plane orthogonal to the thickness of a substrate, to emit a beam from the openings 115 vertically relative to the substrate.

The monitor elements b1 to b4 are adapted to detect the quantity of output light of the corresponding light-emitting elements a1 to a4. Hereinafter, the monitor elements b1 to b4 are denoted as monitor elements B unless otherwise distinguished from each other. The corresponding light-emitting element A and monitor element B are denoted as light-emitting element ax and monitor element bx. The VCSEL chip 11 illustrated in FIG. 1 includes one monitor element bx per light-emitting element ax. In this configuration, the quantity of optical output of one light-emitting element ax is detected by one monitor element bx. The spacing between every set of the light-emitting element ax and the monitor element bx is set constant.

The number, spacing, and arrangement of the light-emitting elements A or monitor elements B illustrated in FIG. 1 are intended for explanation purpose only and not limitative. The correspondence between light-emitting elements ax and monitor elements bx is not limited to one-to-one and may be one-to-multiple or multiple-to-one. The light-emitting elements A may be arrayed two-dimensionally, rather than one-dimensionally, to increase the density of laser beams with higher area efficiency. Although FIG. 1 illustrate the light-emitting elements A of the same size arranged at regular intervals, in actual designing the light-emitting elements A of different sizes may be arranged at different pitches, for example, by increasing (or reducing) the element size or widening or narrowing the spacing in an allowable range set by design rules in the manufacturing process. The turn-on control of the light sources may be selected freely; for example, individual control, group control, or simultaneous control may be selected according to the circuit design. The layout of the light-emitting elements A and the monitor elements B will be described again later.

Figure 3:
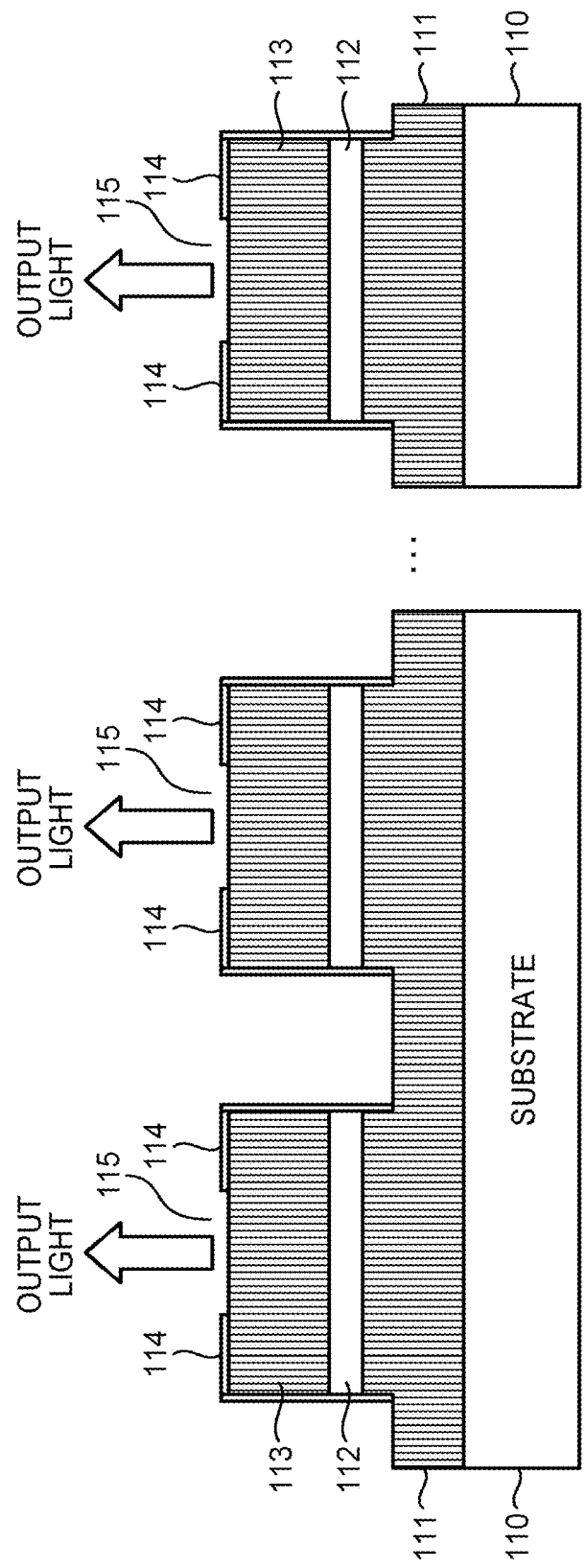
FIG. 3 is a cross-sectional view illustrating a configuration of light-emitting elements and monitor elements along line II to II.

Referring now to FIG. 2 to FIG. 3, a configuration of the light-emitting element A and the monitor element B will be described. FIG. 2 schematically illustrates a configuration of the elements in an I-I cross section (in the thickness direction of the substrate), and FIG. 3 schematically illustrates a configuration of the elements in a II-II cross-section. The light-emitting elements A and the monitor elements B are formed in the same configuration on the substrate 110 through a manufacturing process. In the example illustrated in FIG. 2, the light-emitting element A and the monitor element B both have a mesa structure including a lower distributed Bragg reflector (DBR) 111, an active layer 112, and an upper DBR 113 on a substrate 110.

In this example, the vicinity of the emission center of the light-emitting element A is not covered with an electrode 114 but is open as a window to emit light. That is, the light-emitting element A emits light from the opening 115 illustrated in FIG. 1 in direction of the arrow in FIG. 2. The top surface of the monitor element B is entirely covered with the electrode 114 in order to prevent entry of external light. The light-emitting element A is not limited to a front-surface emission type but may be a back-surface emission type that allows light to be emitted from the substrate side. In this case, the light-emitting element A may not be provided with the opening 115, and the top surface of the light-emitting element A may be entirely covered with the electrode 114.

In this example, as illustrated in FIG. 2 and FIG. 3, a light-emitting mesa and a monitor element mesa are formed with the active layer 112 remaining in a region between the corresponding light-emitting element ax and monitor element bx. In this configuration, the lower DBR layer 111 and the active layer 112 are common to the light-emitting element A and the monitor element B. The active layer 112 functions as a waveguide that optically connects the light-emitting element ax to the monitor element bx to guide leakage light from the light-emitting element A (also referred to as "propagate") through the active layer 112. The monitor element bx detects the quantity of output light of the light-emitting element ax from the quantity of leakage light guided through the active layer 112. The principle of detecting leakage light from the light-emitting element ax by the monitor element bx is described in detail referring to the principle diagrams in FIG. 4 and FIG. 5.

Figure 4:
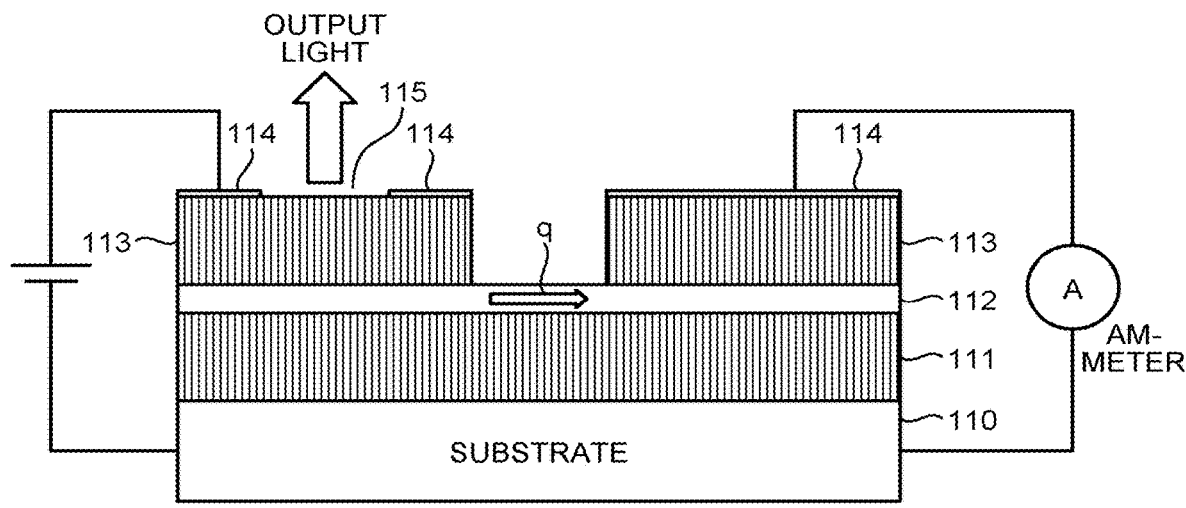
FIG. 4 is an operation diagram for one set of the light-emitting element and the monitor element.
Figure 5:
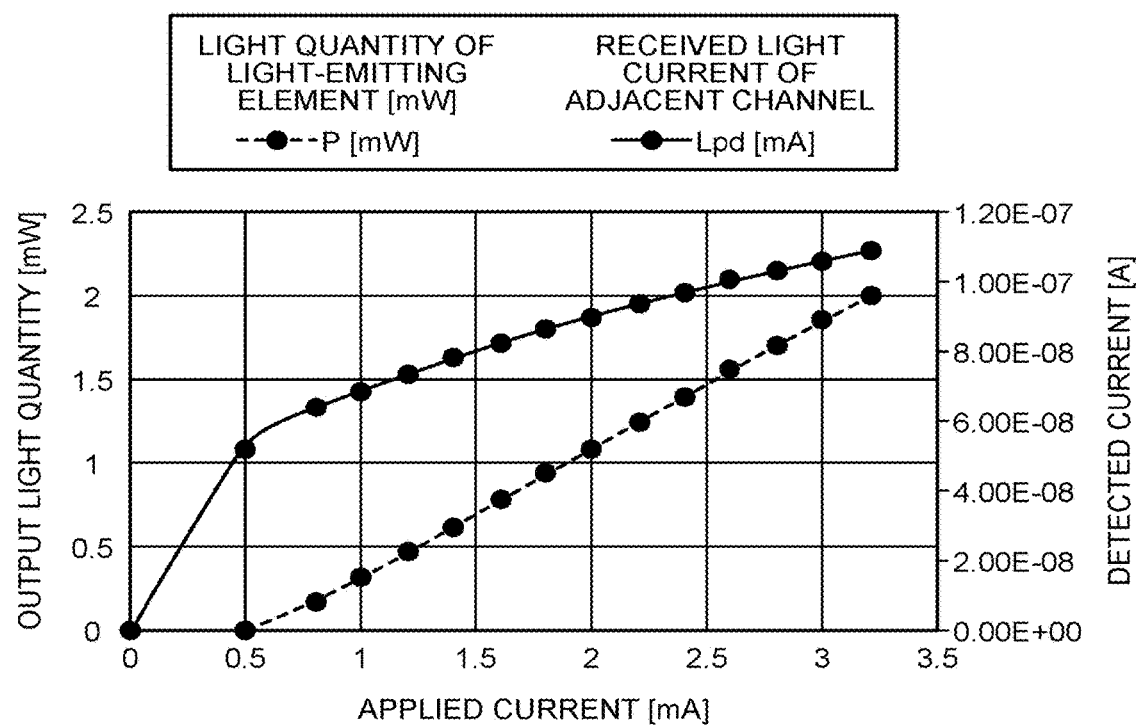
FIG. 5 is a diagram illustrating an exemplary result of measurement of an actual prototype.

FIG. 4 and FIG. 5 are diagrams illustrating the principle of detecting leakage light from the light-emitting element ax by the monitor element bx. FIG. 4 is an operation diagram for one set of the light-emitting element ax and the monitor element bx. As illustrated in FIG. 4, by applying a forward bias to the light-emitting element ax, holes and electrons are injected into the active layer 112 because of potential difference and are recombined with carrier, causing spontaneous emission. Along with increase in the bias, laser oscillation starts vertically relative to the substrate 110 to emit light from the aperture (opening 115), which is a typical VCSEL light emission.

Meanwhile, the monitor element bx, not applied with a bias, functions as an optical sensor utilizing electric charge generated by incident light on the depletion layer. Thus, the active layer 112 guides spontaneous output light and part of leakage light from the light-emitting element ax at the time of laser oscillation to the monitor element bx, to generate electric charge in the monitor element bx in accordance with the quantity of output light of the light-emitting element ax. The electric charge is detected as current by an ammeter A. Light quantity information obtained from the detected current is pure light-quantity information independent of a drive condition and light emission characteristics. The monitor element bx as configured above can implement real-time feedback control by simultaneously detecting the quantity of output light of the light-emitting element ax.

FIG. 5 is a diagram illustrating an exemplary result of actual measurement. The horizontal axis indicates the current value applied to the light-emitting element A, and the first vertical axis (quantity of output light (mW)) indicates light information acquired by an optical power meter from the output light from the light-emitting element A, and the second vertical axis (detected current (A)) indicates current detected from the output of the monitor element B.

As illustrated in FIG. 5, this light-emitting element A starts laser oscillation at about 0.5 mA, and thereafter increases in output light quantity in proportion to the magnitude of the applied current. Although FIG. 5 depicts only the result up to 3.5 mA, it is expected from previous results that good linearity is maintained until immediately before saturation of the output light quantity.

From transition of the detected current measured from the monitor element B after laser oscillation, the detected current also increases linearly with respect to the applied current quantity of output light). Thus, without a complicated correction process which will imposes a large system load, feedback control of the quantity of output light can be anticipated.

From the results above, by using two or more monitor elements bx corresponding to two or more light-emitting elements ax, real-time feedback control of the quantity of output light of the light-emitting elements A can be implemented.

In FIG. 1, part of the active layer 112 remains in the region between the corresponding light-emitting element ax and monitor element bx to form a waveguide, in order to guide light to only the space therebetween. This can prevent the light from the light-emitting element A from reaching the non-corresponding monitor element B, enabling more accurate feedback control.

Figure 6:
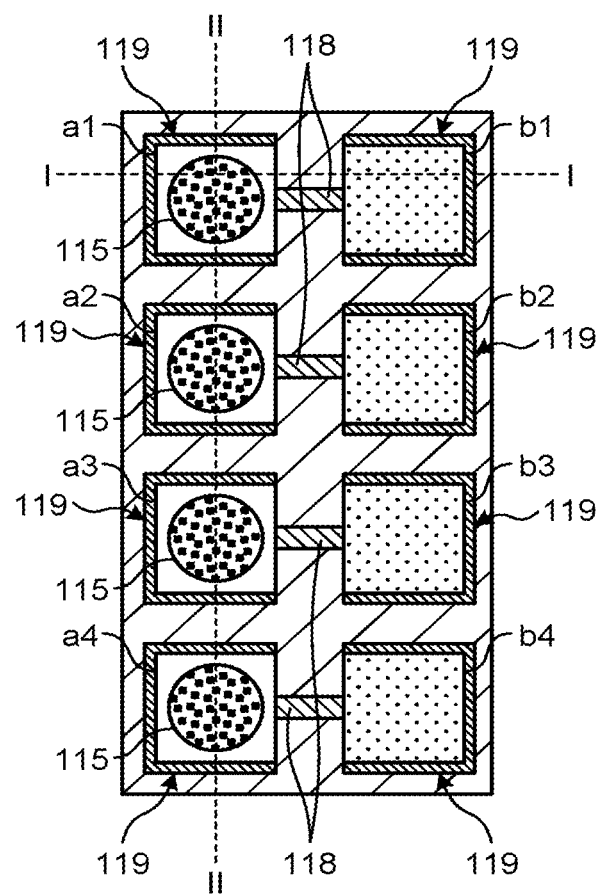
FIG. 6 is a diagram illustrating an exemplary vertical cavity surface emitting laser in FIG. 1 including a light-shielding member.

With a waveguide formed only in a portion that guides light, light may still leak from the end of the waveguide to cause stray light. In view of this, a light-shielding member 119 is provided at the end of the waveguide to prevent light from being emitted from the waveguide to outside. In FIG. 6, the end of the waveguide is covered with the electrode, which also functions as the light-shielding member 119. The light-shielding member 119 may utilize light confinement by refractivity difference in addition to the one completely blocking light, such as a metal film. The light-shielding member 119 may be located on the entire or part of end face of the waveguide 118. FIG. 6 illustrates an example of placement of the light-shielding member 119 in the vertical cavity surface emitting laser illustrated in FIG. 1. In FIG. 6, as an example, no light-shielding member is provided at the active layer end in an opposing part between the light-emitting element ax and the monitor element bx, while the light-shielding member 119 is provided at the rest of the active layer end.

Figure 7:
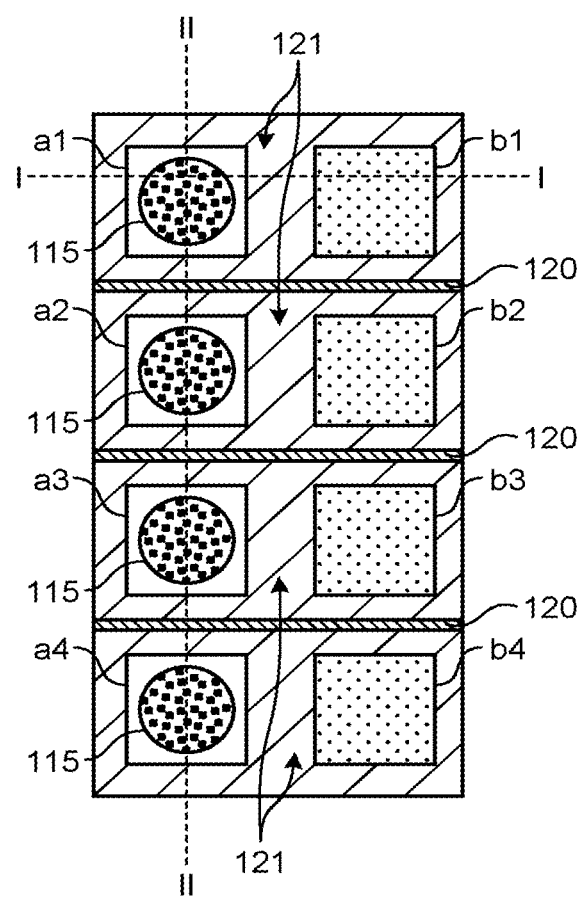
FIG. 7 is a diagram illustrating a vertical cavity surface emitting laser with an active layer between adjacent light-emitting elements and between adjacent monitor elements removed.
Figure 8:
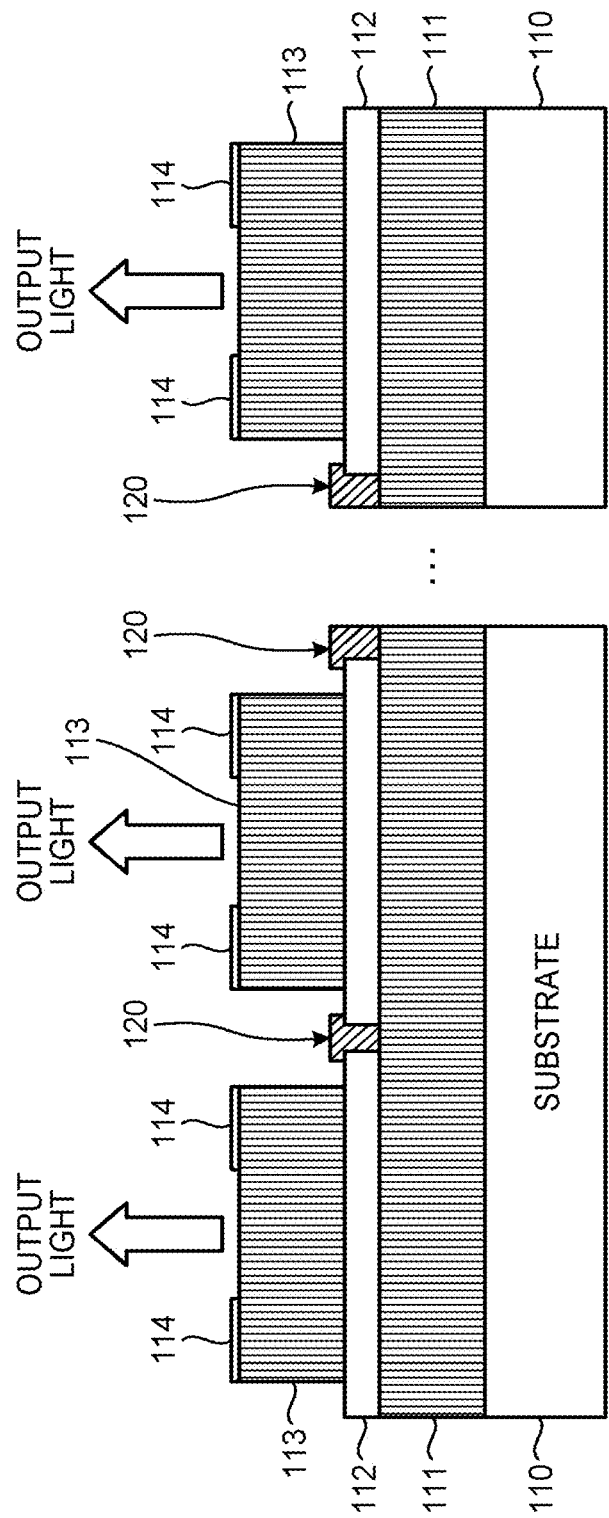
FIG. 8 is a cross-sectional view of the vertical cavity surface emitting laser with the active layer between adjacent light-emitting elements and between adjacent monitor elements removed in FIG. 7, along line B to B.

As illustrated in FIG. 7, the waveguide (active layer) between different sets of light-emitting elements ax and monitor elements bx may be removed. The cross-section of the example illustrated in FIG. 7 along line I-I is similar to the one in FIG. 2, and the cross-section thereof along line II-II is illustrated in FIG. 8. In this example, a metal layer 120 is formed in a region where the waveguide (active layer) is removed, to serve as a light-shielding member. The periphery of the light-emitting element ax and the monitor element bx serves as a waveguide 121.

Figure 9:
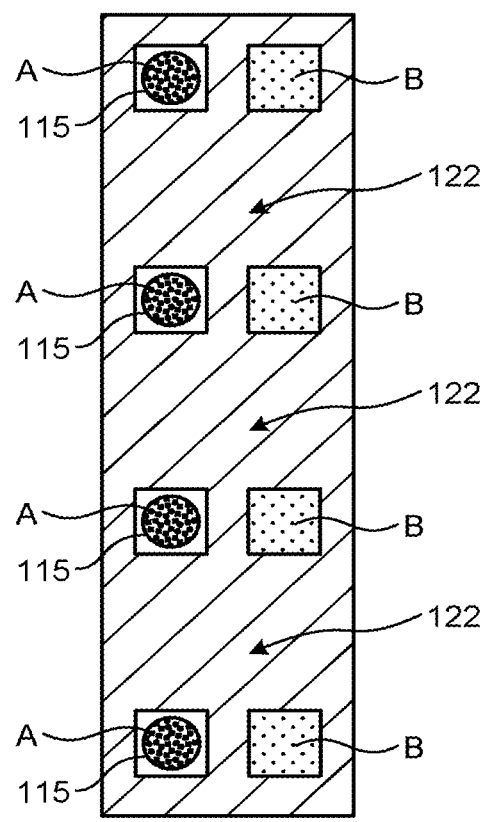
FIG. 9 is a diagram illustrating a vertical cavity surface emitting laser with adjacent light-emitting elements and adjacent monitor elements arranged with larger spacing.

Light guided from the light-emitting element A to the non-corresponding monitor element B may not matter in feedback control. In such a case the active layer may not include a non-waveguide part that does not guide light, as illustrated in FIG. 9, and the entire active layer on the substrate may serve as a waveguide 122. At the time of forming mesas on the light-emitting element A and the monitor element B, the entire active layer can be left by etching, which enables simplification of the process. An exemplary arrangement of the light-emitting elements A and the monitor elements B is illustrated in FIG. 9. In the vertical cavity surface emitting laser in FIG. 9, the non-corresponding light-emitting element A and monitor element B are placed in a longer distance than the corresponding light-emitting element A and monitor element B. In such a configuration, in particular, feedback control is feasible without a non-waveguide part between the non-corresponding light-emitting element A and monitor element B.

The combination and arrangement of the monitor elements B will now be illustrated. FIG. 1 illustrates an example that the monitor elements B are provided for the light-emitting elements A one for one with equal spacing. Examples of layouts such as combination and arrangement are illustrated below.

FIG. 10 is a diagram illustrating an exemplary combination and arrangement of the monitor elements B. FIG. 10(a) illustrates one-to-one arrangement of one light-emitting element A and one monitor element B as a set. FIG. 10(b) illustrates multiple-to-one arrangement of a plurality of light-emitting elements A and one monitor element B as a set. This example is four-to-one arrangement of four light-emitting elements A and one monitor element B as a set. Four light-emitting elements A are optically connected to one monitor element B through the active layer 112. In the case of a set of two or more light-emitting elements A and one monitor element B, real-time feedback control can be performed in units of two or more light-emitting elements. The number of the light-emitting elements A relative to one monitor element B may be optional as long as two or more light-emitting elements A and one monitor element B form a set.

FIG. 10(c) depicts sets of light-emitting elements A and monitor elements B as FIG. 10(a), but the sets of the light-emitting element A and the monitor element B are arranged with different spacings. The measurement result illustrated in FIG. 4 exhibits that along with increase in the quantity of output light of the light-emitting element A, the detected current of the monitor element B increases. That is, the closer to the light-emitting element A the monitor element B is, the larger the amount of the detected current flows, improving the sensitivity to the quantity of output light.

However, if the monitor element B is too close to the light-emitting element A, a problem may arise in the manufacturing process such as etching, which will hinder attainment of intended output characteristics. It is therefore desirable to place the monitor element B as close as possible to the light-emitting element A based on the distance at which the intended output characteristics are obtainable. The sets of the elements may be individually arranged, as illustrated in FIG. 10(c) as a modification, with different spacings. Other combinations may be contemplated. For example, although FIG. 10(b) illustrates multiple-to-one arrangement of multiple light-emitting elements A and one monitor element B as a set, one-to-multiple arrangement of one light-emitting element A and multiple monitor elements B as a set may be contemplated. Thus, the combination or arrangement of the monitor elements B may be modified as appropriate.

FIG. 11 and FIG. 12 are diagrams illustrating exemplary actual speckle images. In each diagram, speckle contrast (Cs) of the speckle image is illustrated.

FIG. 11(a) and FIG. 11(b) are speckle images generated under the same photographic condition when a light source 1 (first light-emitting element) and a light source 2 (second light-emitting element) of the same VCSEL chip 11 were individually turned on under the same drive condition. The light source 1 and the light source 2 are located on the same VCSEL chip 11, however, they have different geometric relations with respected to an irradiated plane (for example, screen), and non-correlated speckle patterns are therefore formed. The light source 1 and the light source 2 can be both regarded as equivalent to Cs≈0.6. Cs of a completely developed speckle is 1.0, however, in actual measurement Cs often takes a value lower than 1.0 due to averaging arising from photographic conditions such as the lens diaphragm of the camera and the image sensor size, or multiplexing resulting from beam characteristics.

FIG. 11(c) is a speckle image generated by simultaneously turning on the light source 1 and the light source 2. The speckle image in FIG. 11(c) is a combination of the speckle image in FIG. 11(a) and the speckle image in FIG. 11(b), exhibiting improved Cs by 20% or more because of the averaging effect.

FIG. 12 is a diagram illustrating exemplary speckle images generated under a different photographic condition for the light source 1 with no change in the photographic condition for the light source 2. FIG. 12(a) depicts a bright image generated with no change in the drive condition at a slower camera shutter speed (exposure time). The same speckle pattern as in FIG. 11(a) is seen with no change in the geometric relation and the drive condition. The average brightness of the overall speckle image is about 4.6 times as high as the average brightness illustrated in FIG. 11(a). Cs is 0.611, that is, substantially remains the same as 0.610 in FIG. 11(a), thus, only the overall brightness value is increased.

FIG. 12(c) is a speckle image generated by simultaneously turning on the light source 1 and the light source 2. The speckle image in FIG. 12(c) is a combined image of the speckle image in FIG. 12(a) and the speckle image in FIG. 12(b), exhibiting improved Cs by 10% or more because of the averaging effect. However, the speckle image in FIG. 12(c) differs in brightness, and exhibits lower averaging effect and lower speckle reducing effect by 10% or more than that of FIG. 11(c).

Figure 13:
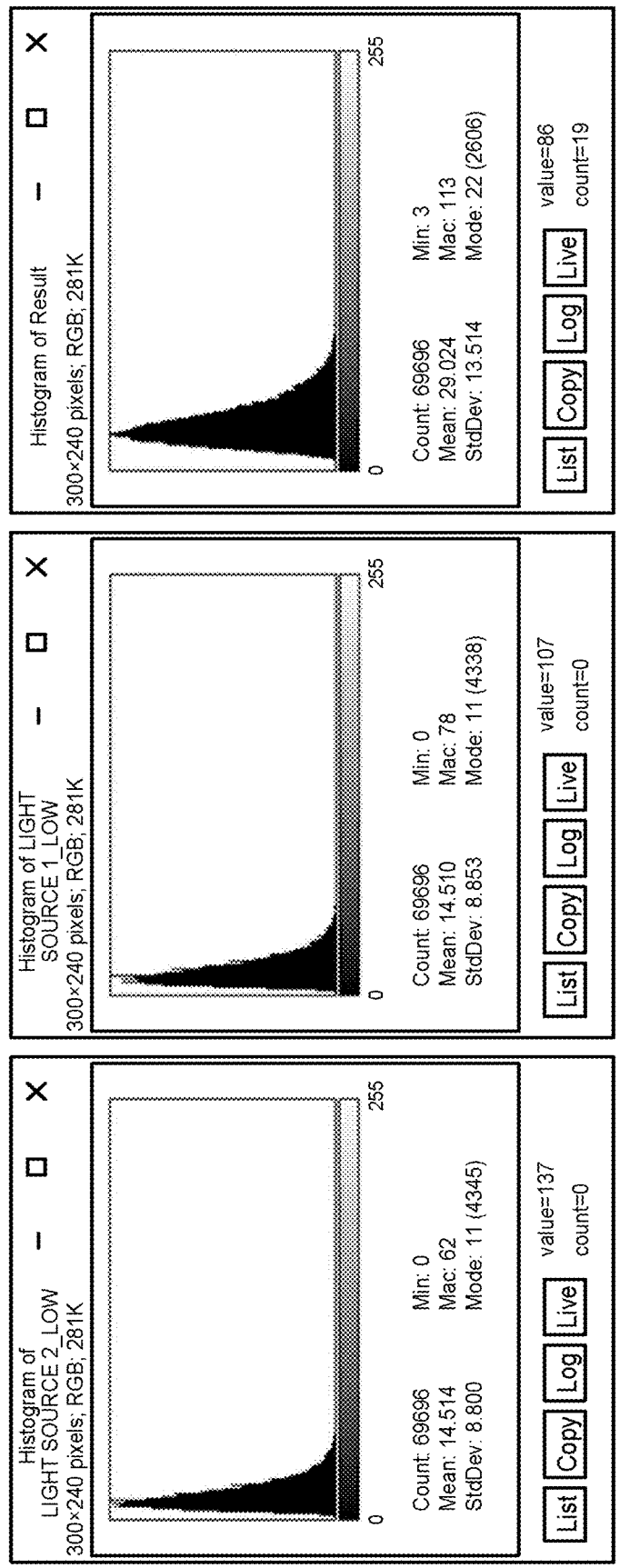
FIG. 13 is a diagram illustrating exemplary brightness histograms of the speckle images in FIG. 11.
Figure 14:
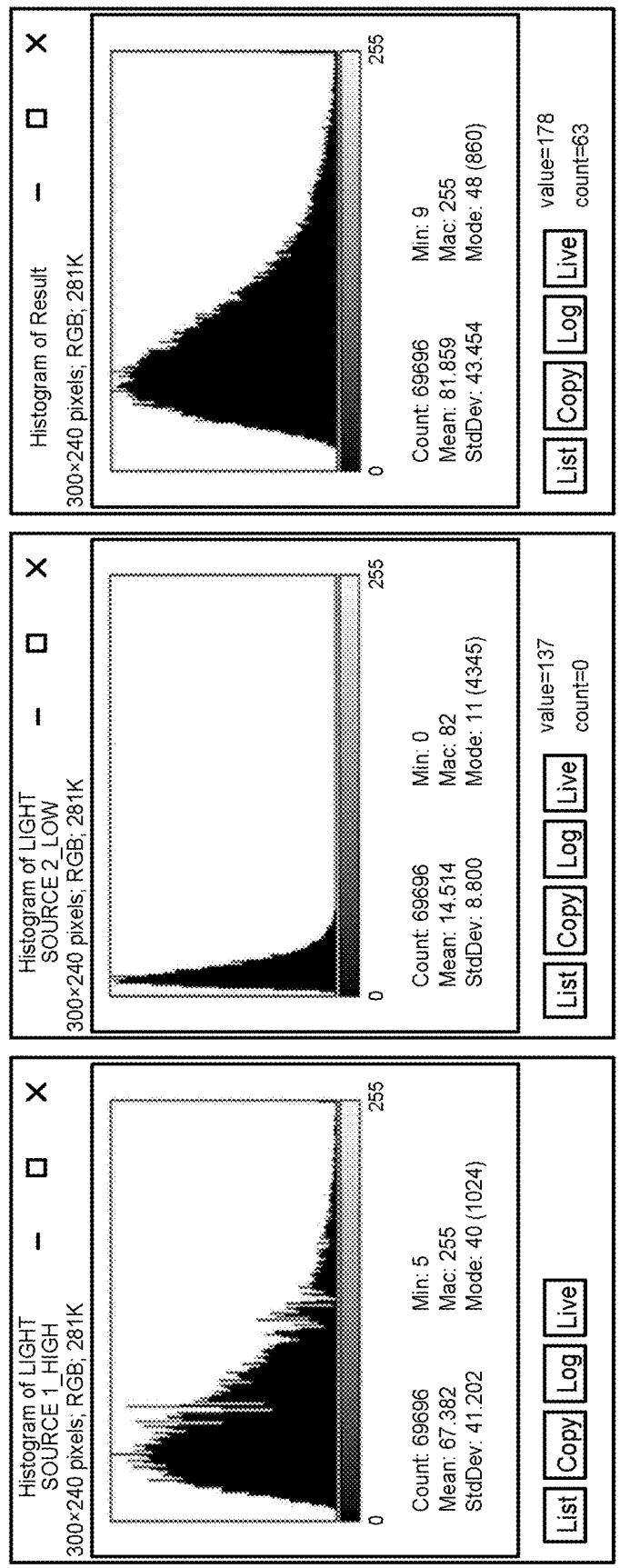
FIG. 14 is a diagram illustrating exemplary brightness histograms of the speckle images in FIG. 12.

FIG. 13 and FIG. 14 are diagrams illustrating exemplary brightness histograms of the speckle images in FIG. 11 and FIG. 12, respectively. More specifically, FIG. 13(a), FIG. 13(b), and FIG. 13(c) correspond to FIG. 11(a), FIG. 11(b). FIG. 11(c), and FIG. 14(a), FIG. 14(b), and FIG. 14(c) correspond to FIG. 12(a), FIG. 12(b), and FIG. 12(c).

From the results above, it is understood that the light-emitting elements on the VCSEL chip are to be controlled to output light at the same level in order to achieve a sufficient speckle-improving effect by multiplexing light sources.

The configuration of a control circuit of the VCSEL chip 11 will now be described. Herein, as an exemplary control unit, a configuration of a feedback control circuit that performs feedback control using the monitor element B will be described.

Figure 15:
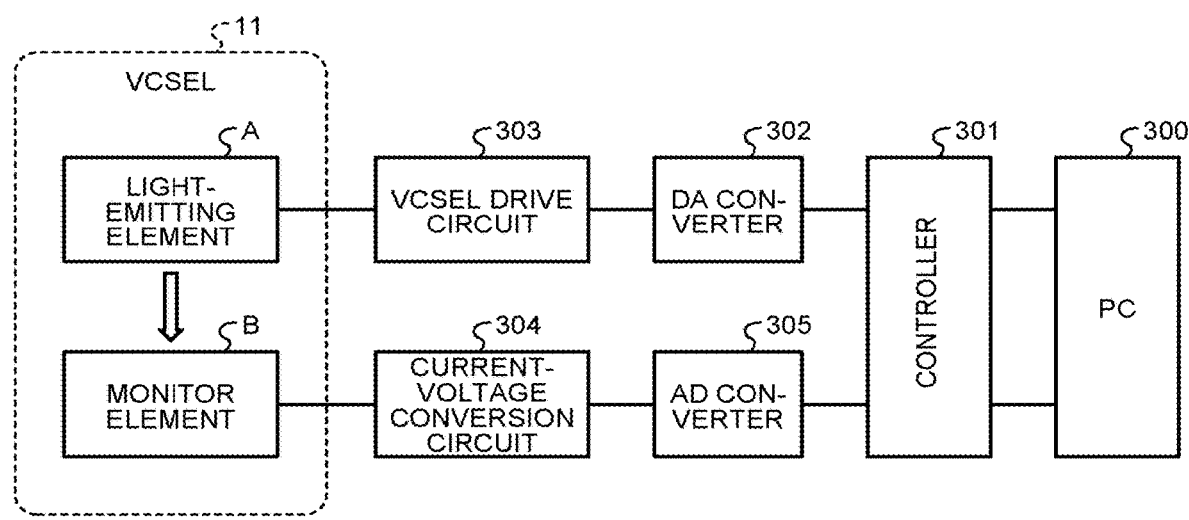
FIG. 15 is an exemplary block configuration diagram of a feedback control circuit of a VCSEL chip.

FIG. 15 is a block configuration diagram of an exemplary feedback control circuit of the VCSEL chip 11. FIG. 15 illustrates a pair of the light-emitting element A and the monitor element B. That is, a one-to-one arrangement includes one light-emitting element A and one monitor element B, and a multiple-to-one arrangement includes multiple light-emitting elements A and one monitor element B. For the sake of explanation, a feedback control circuit per unit of a light-emitting element A and monitor element B pair is described.

First, a controller 301 to perform the entire control transmits a VCSEL drive signal in accordance with initial settings input from a PC 300 to apply a bias to the light-emitting element A on the VCSEL surface through a DA (digital-to-analog) converter 302 and a VCSEL drive circuit 303. Then, laser oscillation occurs, as long as the light-emitting element A is non-defective, and part of scattered light (leakage light) is incident on the monitor element B through the active layer.

The monitor element B generates electric charge in accordance with incident light so that it can be treated as a detected signal (electrical signal). The electric charge is converted by a current-voltage conversion circuit 304 into a voltage signal and then output from an AD (analog to digital) converter 305 as a digital signal to the controller 301. The controller 301 compares the input detected signal with a set value corresponding to intended quantity of output light (set value at which the light-emitting elements A output at the same output level) and outputs a VCSEL drive signal (control signal) again so as to approach the set value.

The detected signal can be maintained at a value close to the set value through a series of operations in real time, thereby enabling the light-emitting elements A to output light stably, that is, uniformly output light of a given quantity.

When a detected signal from the monitor element B is greater or smaller than a set threshold in spite of real-time feedback control, the corresponding light-emitting element A is regarded as being defective, and the controller 301 promptly stops applying a bias and transmits an alarm signal to the PC 300. Although the region of the VCSEL chip 11 is surrounded by a dotted line in FIG. 15, all or part of the functional blocks (feedback unit) other than the light-emitting elements A and the monitor elements B may be mounted on the VCSEL chip 11.

As described above, according to the vertical cavity surface emitting laser (VCSEL) in the first embodiment, the monitor elements B detect the quantity of output light of the light-emitting elements A to regulate the quantity of output light from each light-emitting element A to a given value in real time. This enables the light-emitting elements A to stably output light and lower difference in average brightness to achieve the expected noise reducing effect of $1/\sqrt{n}$.

Second Embodiment

An embodiment of an optical device including the VCSEL chip 11 of the first embodiment will be illustrated. In order to improve speckle contrast (Cs) to a theoretical value of $1/\sqrt{n}$, random speckle patterns are to be superimposed on each other. This is on the premise that different speckle patterns appear by light emitted from the light-emitting elements A.

This is achievable by, for example, multiple light source angular multiplexing or multiple light source wavelength-multiplexing. In the multiple light source angular multiplexing, different speckle pattern images are multiplexed by changing the incident angle of light on the expected irradiated surface for each light-emitting element A. In the multiple light source wavelength-multiplexing, different speckle pattern images are multiplexed by changing oscillation wavelength for each light-emitting element A.

To design an optical device using the multiple light source angular multiplexing, the set values D1, θ1, and LDW1 are appropriately set to values which enable the theoretical value $1/\sqrt{n}$. Herein, D1 represents the distance between two adjacent light-emitting elements A. θ1 represents incident angle of light fluxes output from two adjacent light-emitting elements A on an irradiated surface. LDW1 represents the distance between a virtual light source of light incident at the angle θ1 and the irradiated surface.

Figure 16:
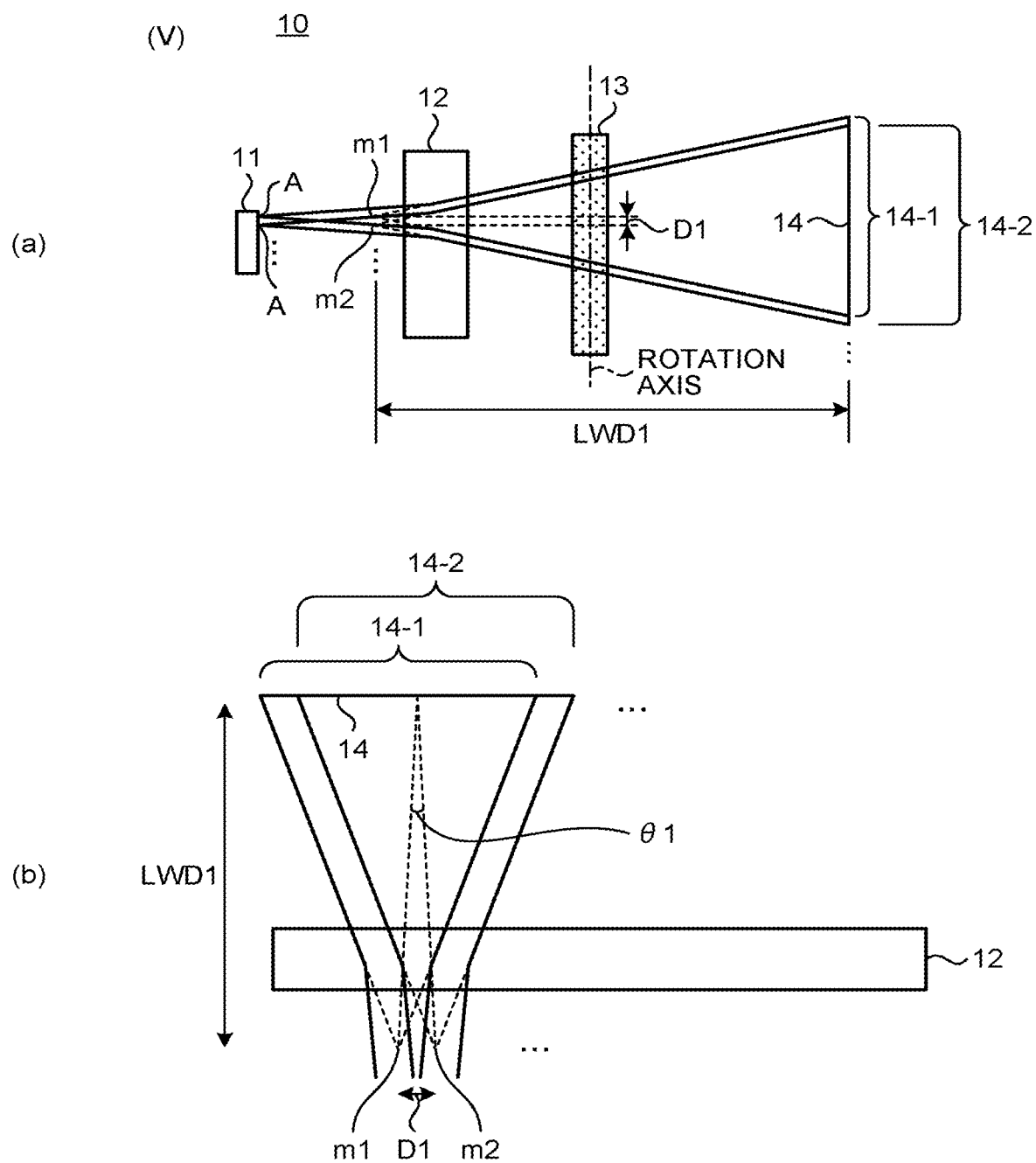
FIG. 16 is an exemplary configuration diagram of an optical device including a light-deflecting element with a larger mirror surface in a second embodiment.
Figure 17:
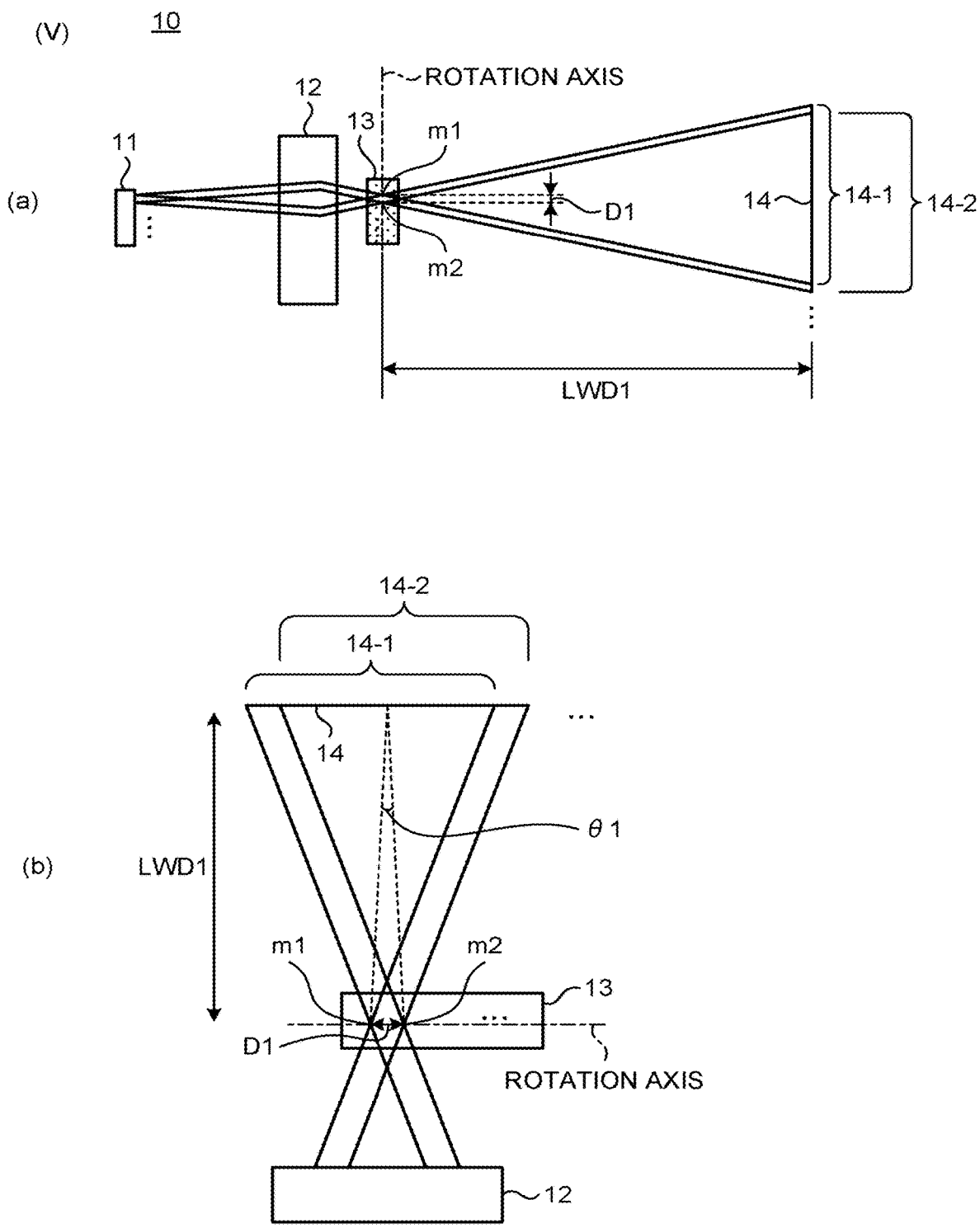
FIG. 17 is an exemplary configuration diagram of an optical device including a light-deflecting element with a smaller mirror surface in the second embodiment.

FIG. 16 and FIG. 17 are diagrams illustrating an exemplary optical device according to an embodiment. FIG. 16 and FIG. 17 both illustrate the configuration of the optical device as viewed from vertical direction (V). The optical device projects linear light as an example of projector. Herein, the vertical direction (V) refers to a direction orthogonal to horizontal direction (H) described later.

FIG. 16(a) illustrates a configuration of the optical device including a light-deflecting element with a larger mirror surface, and FIG. 17(a) illustrates a configuration of the optical device including a light-deflecting element with a smaller mirror surface as a micro electro mechanical system (MEMS) mirror.

FIG. 16(b) and FIG. 17(b) depict the angle θ1 between light fluxes incident on the irradiated surface from adjacent virtual light sources (for example, a light source m1 and a light source m2) of each of the optical devices in FIG. 16(a) and FIG. 17(a). FIG. 16(b) omits illustrating the VCSEL chip 11 and the mirror 13 for the sake of better understanding of optical paths. FIG. 17(b) omits illustrating the VCSEL chip 11 for the sake of better understanding of optical paths.

The optical device 10 illustrated in FIG. 16, as an example, includes a VCSEL chip 11 having a plurality of light-emitting elements A, a line generator 12, and a mirror (light-deflecting element) 13.

The line generator 12 is an exemplary optical element that converts light from the light-emitting elements A on the VCSEL chip 11 into linear light. FIG. 16 and FIG. 17 omit depicting the lens arrangement of the line generator 12 for the sake of better understanding of optical paths.

In FIG. 16 the mirror surface (indicated by shading) of the mirror 13 faces forward, and moves around the rotation axis.

In FIG. 16 the output light from the light-emitting elements A on the VCSEL chip 11 is converted into linear light by the line generator 12. Light emitted from the line generator 12 is reflected by the mirror surface of the mirror 13 and irradiates the surface as one linear light 14. FIG. 16 illustrates the optical paths of output light from two adjacent light-emitting elements A on the VCSEL chip 11, as an example. As seen from the optical paths of the two light-emitting elements A, all or part of the light beams from the light-emitting elements A are combined into substantially one linear light on the irradiated surface as linear light 14-1 and linear light 14-2.

As illustrated in FIG. 16, at the position of the mirror 13, the mirror surface is longer in length than the longitudinal direction (along the rotation axis of the mirror 13) of light (linear light 14) exiting from the line generator 12. Thus, the linear light 14 can be incident on the mirror surface with no adjustment of the length (along the rotation axis of the mirror 13) of the linear light 14.

In the case of a smaller mirror surface such as a MEMS mirror, as illustrated in FIG. 17, the light (linear light 14) exiting from the line generator 12 is to be adjusted in length (along the rotation axis of the mirror 13) to be incident on the mirror surface. In the example illustrated in FIG. 17, the line generator 12 concentrates and allows linear light to be incident on the mirror surface. In this case, the virtual light sources m1, m2, . . . are located as illustrated in FIG. 17.

The size of the mirror surface may be optionally set as long as it is sufficient to allow incidence of scanning linear light. For example, FIG. 17 illustrates a small mirror surface. However, a larges mirror surface may be used in view of condensing light. The mirror surface in FIG. 17 may not be inserted in the focal point of the linear light but offset along the optical axis as long as the mirror surface receives the scanning linear light. However, the size of the mirror surface can be minimized when placed at the focal point of the linear light.

As described above, the optical device includes the VCSEL chip 11. Thereby, in the optical device designed to have values that enable attainment of the effect of $1/\sqrt{n}$, the quantity of output light of the light-emitting elements A can be feedback controlled in real time. That is, the light-emitting elements A stably output light in quantity and output light at the same level. The superimposed speckle patterns can be made uniform in terms of average brightness, realizing the effect of $1/\sqrt{n}$.

Example 1

An exemplary application of the optical device according to the second embodiment will be described. The optical device according to the second embodiment is applicable to a measuring device for use in measuring an observed object. Herein, a three-dimensional measuring device for an observed object (also referred to as object to measure) is described as an application example of a measuring device.

Figure 18:
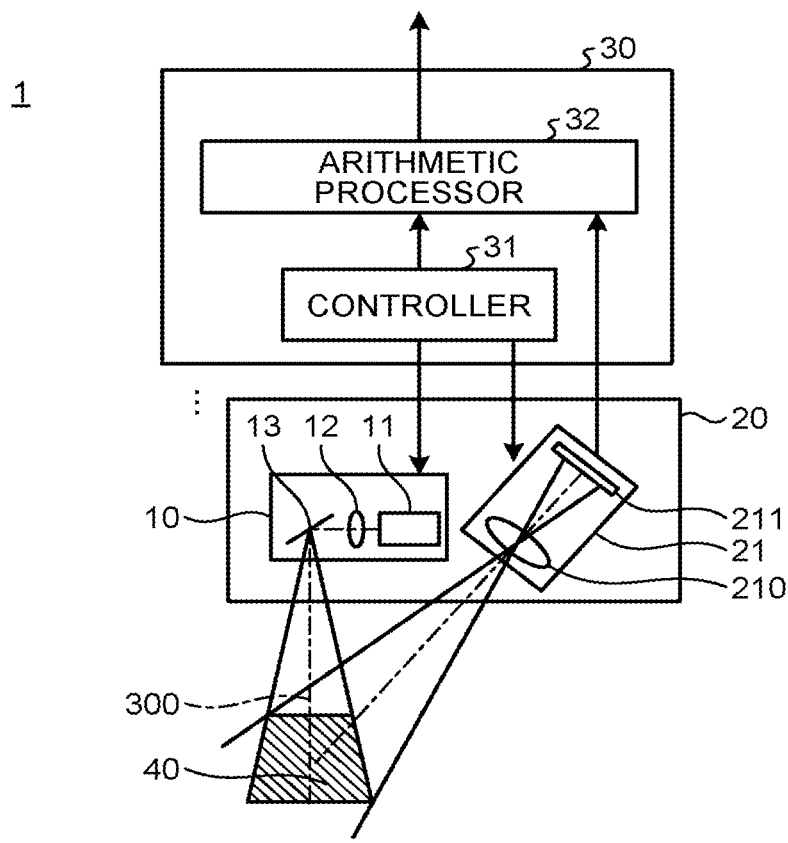
FIG. 18 is a diagram illustrating an exemplary measuring device.

FIG. 18 is a diagram illustrating an exemplary measuring device. A measuring device 1 illustrated in FIG. 18 includes a measurement information acquisition unit 20 and a control unit 30.

The measurement information acquisition unit 20 includes an optical device 10 as a projector and a camera 21 as an imager. The optical device 10 includes a VCSEL chip 11, a line generator 12 (optical system), and a light-deflecting element (mirror) 13. The measurement information acquisition unit 20 operates under the control of a controller 31 of the control unit 30. For example, the controller 31 allows the light-emitting elements A on the VCSEL chip 11 to emit light, and allows the light-deflecting element 13 to deflect the light output through the line generator 12 to scan an object to measure. The controller 31 projects pattern light on the entire object to measure by adjusting the output and the turn-on timing of each light-emitting element A on the VCSEL chip 11 during optical scanning. For example, a desired projection pattern such as a black and white gray code pattern can be projected onto the object to measure by controlling turning-on and -off of the light-emitting elements A.

The position and angle of the camera 21 are stationary such that a projection center 300 of pattern light (projected image) projected by the optical device 10 to an object to measure matches the center of an imaging region 40. Thereby, the camera 21 generates an image of the projection region.

The camera 21 includes a lens 210 and an imager 211. Examples of the imager 211 include a charge coupled device (CCD) and a complementary metal oxide semiconductor (CMOS). Light is incident on the camera 21 and imaged on the imager 211 through the lens 210 and converted into an electrical signal. The electrical signal converted by the imager 211 is converted into an image signal, and output from the camera 21 to an arithmetic processor 32 of the control unit 30.

The control unit 30 performs control over the optical device 10 to project pattern light and the camera 21 to generate an image of pattern light to perform arithmetic processing such as three-dimensional measurement of an intended object, in accordance with an image signal (image information) generated by the camera 21. The controller 31 may control the optical device 10 to switch pattern light to project to another pattern light. The controller 31 may control the arithmetic processor 32 to output calibration information for use in calculation of three-dimensional coordinates.

The arithmetic processor 32 of the control unit 30 calculates three-dimensional coordinates based on the input image signal and acquires a three-dimensional shape. The arithmetic processor 32 outputs three-dimensional shape information representing the calculated three-dimensional shape to a personal computer (PC) (not illustrated) in response to an instruction from the controller 31. FIG. 18 illustrates a set of measurement information acquisition units 20 attached to the control unit 30. However, a plurality of sets of measurement information acquisition units 20 may be attached to the control unit 30.

Operation of Optical Device

Figure 19:
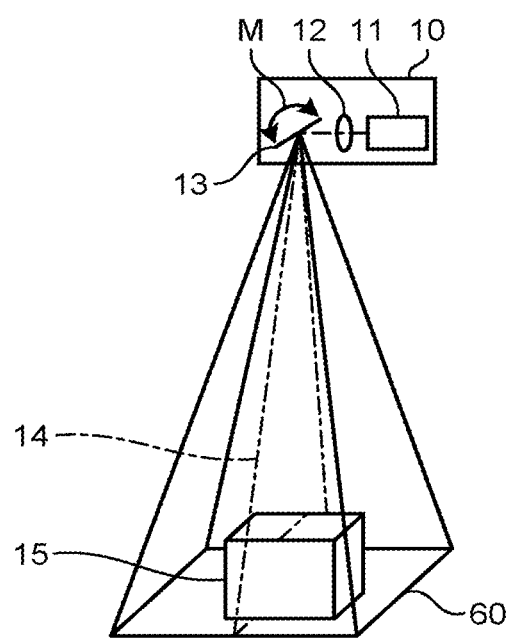
FIG. 19 is a diagram illustrating an exemplary light projection to an object to be measured by the optical device.

FIG. 19 is a diagram illustrating an exemplary light projection to an object to measure by the optical device 10. In FIG. 19, the optical device 10 emits linear light 14 toward an object to measure 15. The linear light 14 is combined light of light fluxes from the light-emitting elements A on the VCSEL chip 11 and is deflected by the mirror surface of the light-deflecting element (mirror) 13 to irradiate the object to measure 15 as illustrated by the broken lines in FIG. 19. Specifically, the light-deflecting element 13 is controlled such that the mirror surface is driven in the direction around the longitudinal axis M of linear light illustrated in FIG. 19 to deflect the light irradiating the mirror surface, to form the linear light into given pattern light. Thereby, the object to measure 15 is irradiated with two-dimensional pattern light and a projection image 60 is projected onto the object to measure 15. The projection image 60 is projected onto, for example, a region including the object to measure 15.

Configuration of VCSEL

Figure 20:
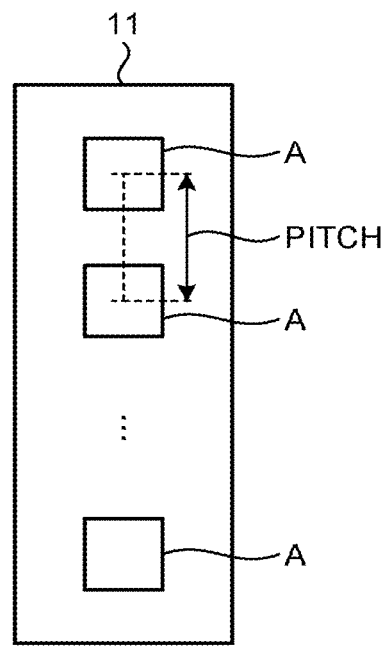
FIG. 20 is an exemplary configuration diagram of the VCSEL chip.

FIG. 20 is a diagram illustrating an exemplary hardware configuration of the VCSEL chip 11. The VCSEL chip 11 illustrated in FIG. 20 is a vertical cavity surface emitting laser that can integrally include light-emitting elements A on the same substrate, and includes a plurality of light-emitting elements A one-dimensionally arranged.

The pitch of the light-emitting elements A illustrated in FIG. 20 can be set as desired as long as the spacing D1 of virtual light sources m1, m2, . . . is set to attain the effect of $1/\sqrt{n}$.

The arrangement of the light-emitting elements A illustrated in FIG. 20 is by way of example, and the light-emitting elements A may be arranged in two dimensions. For example, a honeycomb arrangement of more elements or any other arrangements may be employed. The shape of the openings of the light-emitting elements A is depicted as a quadrangle but may be, for example, a hexagon or any other shapes. The wavelength of laser light of each light-emitting element A may be set as appropriate. For example, light may be visible or invisible. The light emissions of the light-emitting elements A may be independently controllable.

Figure 21:
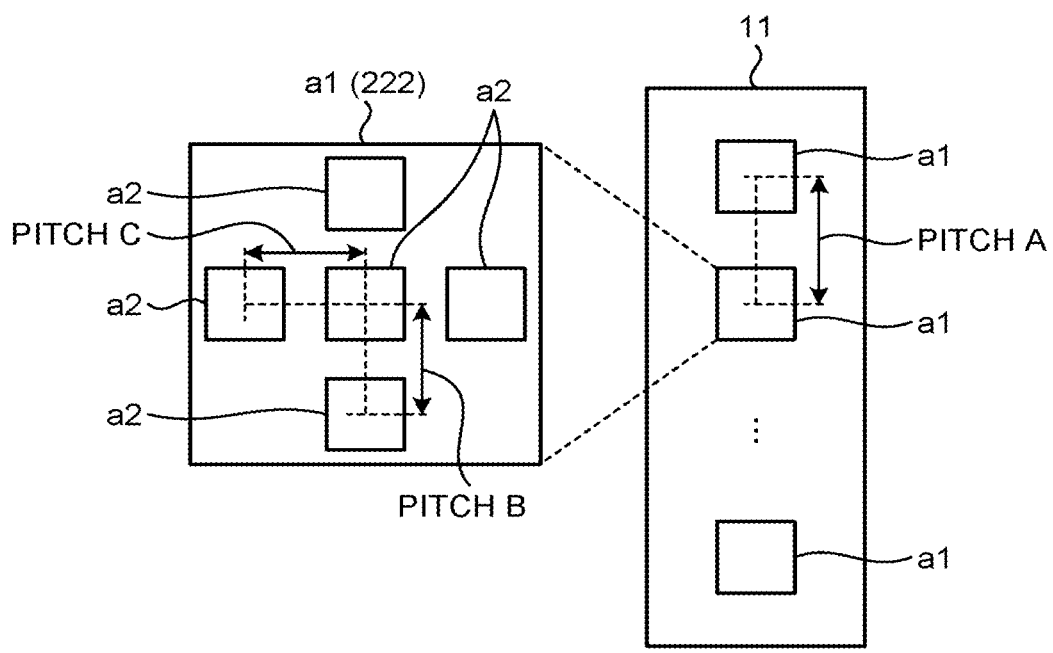
FIG. 21 is another exemplary configuration diagram of the VCSEL chip.

FIG. 21 is a diagram illustrating another exemplary configuration of the VCSEL chip 11. The VCSEL chip 11 illustrated in FIG. 21 includes one or more groups of light-emitting elements a1 being a layer that emit light together. FIG. 21 illustrates that the light-emitting element groups a1 are arranged in one dimension, however, they may be two-dimensionally arranged.

In the layer 222 illustrated in FIG. 21, five light-emitting elements a2 are arranged in cross form. The light-emitting elements a2 of the same layer 222 emit light at the same timing.

The pitch A of the layers 222 and the pitch (pitch B and pitch C) of the light-emitting elements a2 illustrated in FIG. 21 vary depending on the specification of the measuring devices 1 and may be optionally set as long as the spacing D1 of virtual light sources m1, m2, . . . is set to exert the effect of $1/\sqrt{n}$.

FIG. 21 illustrates five light-emitting elements a2 of the layer 222 arranged in cross form, however, the embodiment is not limited thereto. The number of light-emitting elements a2 may be increased or decreased, or more light-emitting elements a2 may be arranged in a layout such as honeycomb structure.

Although the light-emitting element a2 having a quadrature opening is illustrated, the opening may have a hexagonal shape or other shapes. Light emission may be independently controlled in each individual layer 222.

Lens Arrangement of Line Generator

Figure 22:
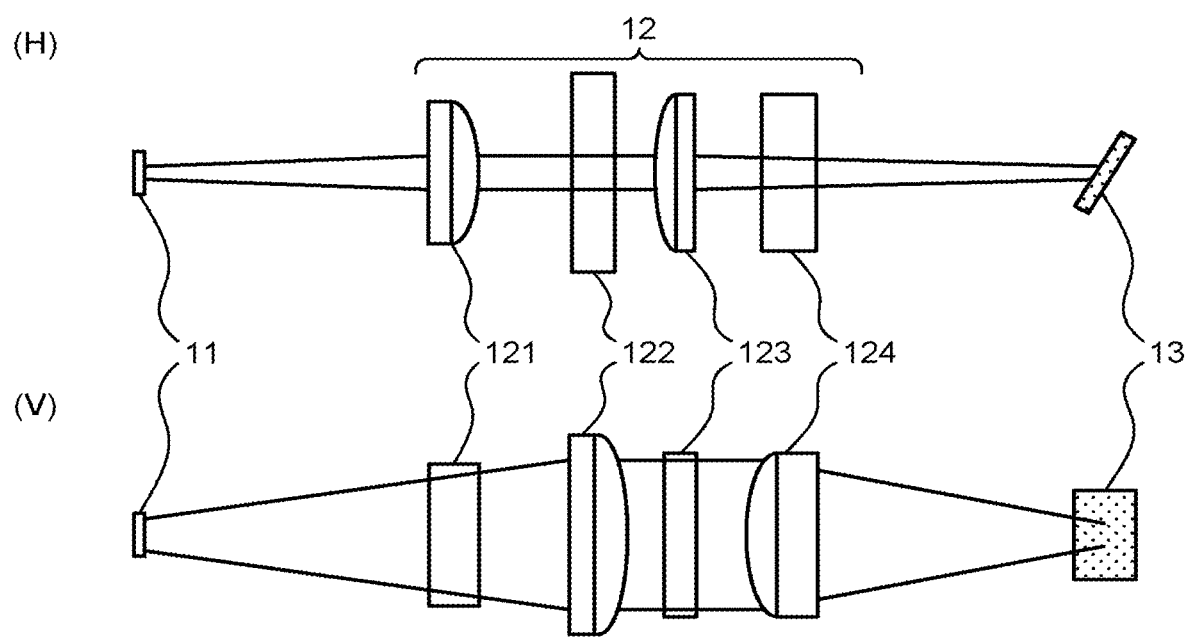
FIG. 22 is a diagram illustrating an exemplary optical system of the optical device.

FIG. 22 is a diagram illustrating an exemplary optical system of the optical device 10. FIG. 22 illustrates the optical system of the optical device 10a in the horizontal direction (H) and in the vertical direction (V).

FIG. 22 illustrates an exemplary lens arrangement of the line generator 12 including four cylindrical lenses 121 to 124. The cylindrical lenses 121 to 124 individually convert light from the light-emitting elements A on the VCSEL chip 11 into linear light.

Specifically, in the horizontal direction (H), the cylindrical lens 121 converts light diverging from the VCSEL chip 11 into a parallel or substantially parallel beam and the cylindrical lens 121 adjusts linear light in width. In the vertical direction (V), the cylindrical lens 122 converts light diverging from the VCSEL chip 11 into a parallel or substantially parallel beam, and the cylindrical lens 124 adjusts linear light in length. The focal point is set at a light concentrate position of the mirror (light-deflecting element) 13. Individual linear light beams form on the light-deflecting element 13 with the settings which enable attainment of the effect of $1/\sqrt{n}$.

The cylindrical lenses 121 to 124 are made from, for example, glass or plastic. The material is not limited thereto. Any other materials may be used. The cylindrical lenses 121 to 124 may be surface-treated, for example, with AR coating.

The cylindrical lenses may be inserted in any direction. Considering the number of refractions, the cylindrical lenses are preferably inserted such that the convex surfaces face each other, as illustrated in FIG. 22.

The light-deflecting element 13 is driven around the longitudinal axis of linear light and scans the object to measure 15 with linear light incident on the light-deflecting element 13. The controller 31 modulates output of the linear light during scanning, to project an image having a given pattern onto the object to measure 15.

Figure 23:
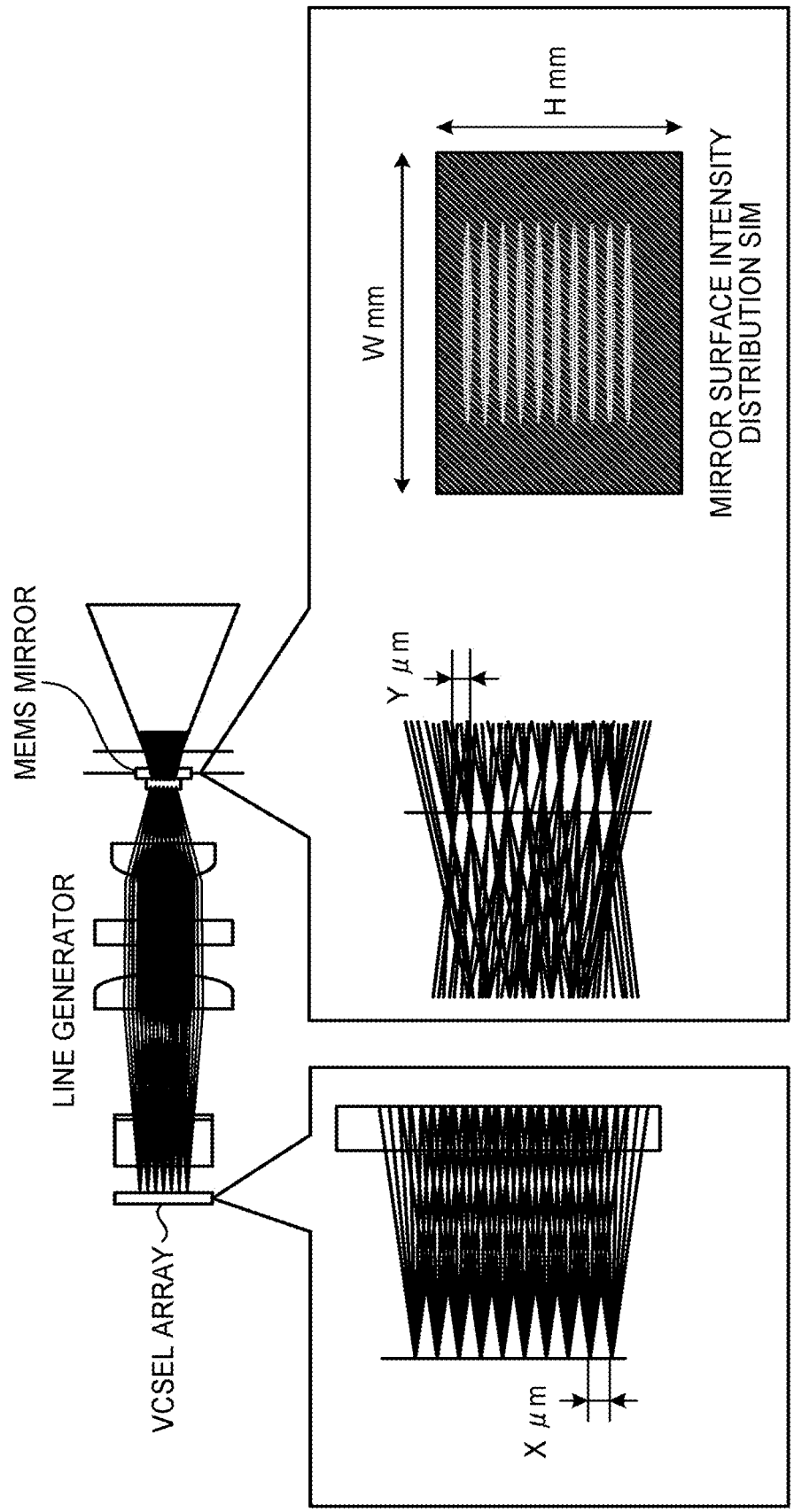
FIG. 23 is a diagram illustrating an optical path in the optical device.
Figure 24:
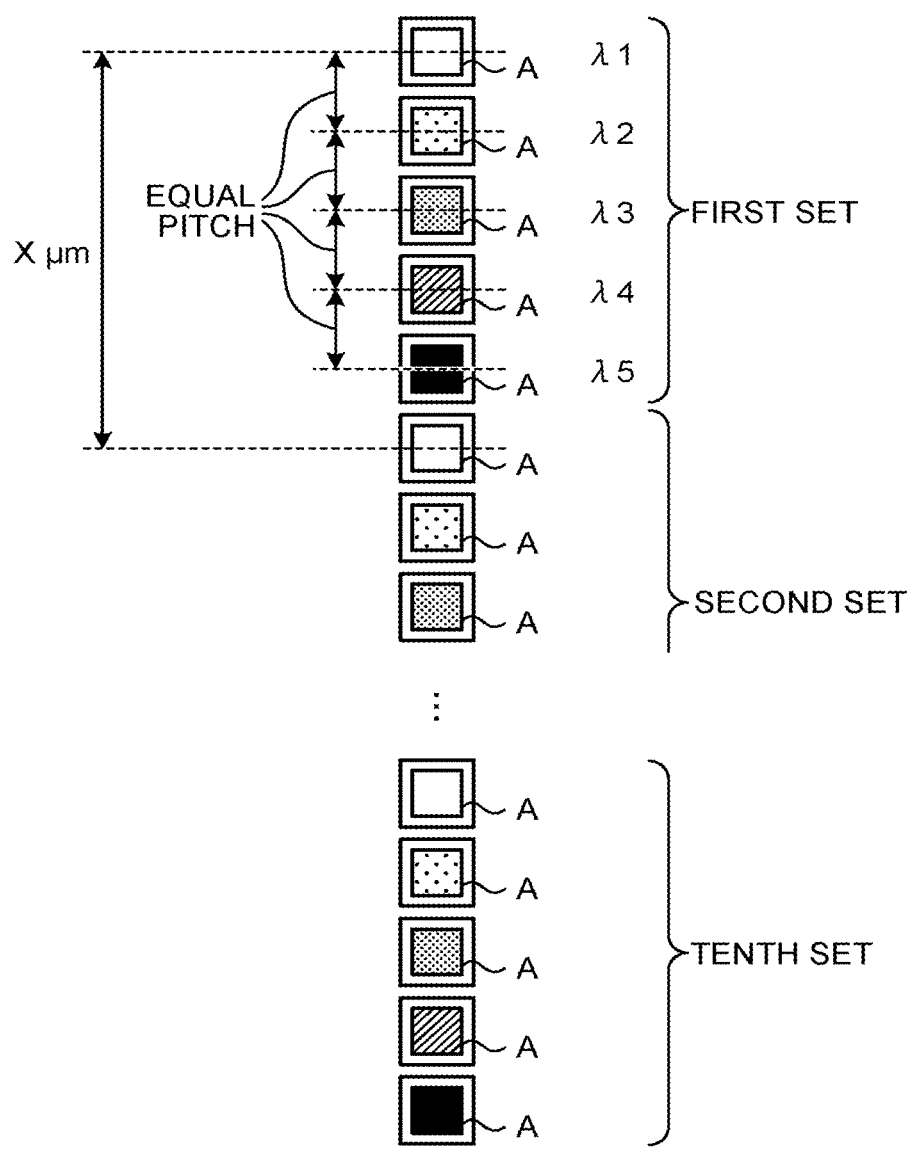
FIG. 24 is a diagram illustrating an exemplary array of light-emitting elements of the VCSEL of the optical device.

FIG. 23 is a diagram illustrating exemplary optical paths of light in the optical device 10. FIG. 23 illustrates the optical device 10 including a MEMS mirror with a narrow mirror surface as the light-deflecting element 13. As illustrated in FIG. 24, in the VCSEL chip 11 of the optical device 10 in FIG. 23, light-emitting elements A with five different wavelengths (wavelength $\lambda 1$, wavelength $\lambda 2$, wavelength $\lambda 3$, wavelength $\lambda 4$, wavelength $\lambda 5$) arranged at equal pitch form one set, and, a total of 10 sets (5 different wavelengths× 10 sets=50) of light-emitting elements A are arranged in one dimension. In each set, the light-emitting elements A are arranged in order of a given wavelength. That is, the light-emitting elements A with the respective wavelengths are arranged at periodic positions in FIG. 24. In FIG. 24, the light-emitting elements A with the same wavelength between the adjacent sets are arranged at X-µm pitch. The speckle patterns produced by the light-emitting elements A with the same wavelength among the sets are set to be different from each other, so as to be able to achieve the multiple light source angular multiplexing effect. The speckle patterns produced by the light-emitting elements A with wavelengths $\lambda 1$ to $\lambda 5$ in the same set are also set to be different from each other, to be able to achieve the multiple light source wavelength-multiplexing effect. This configuration is only by way of example, and at least some of the wavelengths may be different.

The optical path illustrated in FIG. 23 indicates that linear light beams formed from the light from the light-emitting elements A with wavelength $\lambda 1$ on the VCSEL chip 11 are superimposed on each other. FIG. 23 omits depicting the optical paths of light-emitting elements A with wavelengths $\lambda 2$ to $\lambda 5$ for the sake of better understanding of optical path. As illustrated in FIG. 23, the line generator 12 forms linear light from the light from each light-emitting element A on the VCSEL chip 11. The light-emitting elements A emit light at the same divergence angle, and the spread angle of linear light in the lengthwise direction and the width the linear light are adjusted through the line generator 12. Since the lengthwise direction of linear light is adjusted by the mirror surface and the width thereof is adjusted in each direction so as to be condensed within the measurement range, the width of each linear light on the mirror surface is longer than the length of the linear light finally formed. FIG. 23 illustrates the mirror surface intensity distribution SIM. Also in the mirror surface intensity distribution SIM, the state of incident linear light can be observed as described above. Thus, by condensing the lengthwise direction of the linear light by the mirror surface, the mirror surface can be reduced in size and the spread angle of the linear light in the lengthwise direction can be increased. With a smaller number of linear light beams from the light-emitting elements A, the mirror size is such that the side of the mirror is longer in length in the widthwise direction of the linear light finally formed than in the lengthwise direction, as illustrated in FIG. 23 (W mm>H mm).

At least one of the linear light beams formed from the light from the light-emitting elements A may be spaced differently from the other linear light beams. For example, the spacing (X μm) between the light-emitting elements with the same wavelength is different from the spacing (Y μm) between the linear lights of the same wavelength incident on the light-deflecting element. The relation between the spacing (X μm) between the light-emitting elements with the same wavelength and the spacing (Y μm) between the linear lights of the same wavelength incident on the light-deflecting element will be described below.

To produce different speckle patterns with the light-emitting elements with the same wavelength, that is, to set the optical device 10 to exert the speckle noise reducing effect (which may be referred to as "the expected effect of $1/\sqrt{n}$") by the multiple light source angular multiplexing, the spacing (X μm) between the light-emitting elements with the same wavelength and the spacing (Y μm) between linear lights of the same wavelength incident on the light-deflecting element are set to satisfy the relation: the spacing between the light-emitting elements with the same wavelength≥the spacing between linear lights of the same wavelength incident on the light-deflecting element.

As another example, the spacing between the light-emitting elements at the same wavelength and the spacing between linear lights of the same wavelength incident on the light-deflecting element may be set to satisfy the relation: the spacing between the light-emitting elements at the same wavelength<the spacing between linear lights of the same wavelength incident on the light-deflecting element. In this case, the spacing between linear lights of the same wavelength incident on the light-deflecting element is set to 35 μm or more. This value is calculated as follows. Specifically, at the angle or greater where the multiple light source angular multiplexing effect (the effect of $1/\sqrt{n}$) starts occurring (for example, θ1=0.04 degree), the speckle noise reduction effect can occur. For example, considering a microscope, LWD1 can be set to a small value equal to or greater than 50 mm. From these values, given spacing Y between linear lights of the same wavelength incident on the light-deflecting element is calculated about 34.9 μm or more, and Y is about 35 μm. The expression will be such that given Y=2×LWD1×tan(θ½), D1=2×50×tan(0.02)=34.907 (about 35) μm.

Upon satisfaction of the relation: the spacing between the light-emitting elements at the same wavelength<the spacing between linear lights of the same wavelength incident on the light-deflecting element, the speckle noise reduction effect can be obtained at the angle (θ=0.04 degree) or greater where the multiple light source angular multiplexing effect starts occurring, and an upper limit of the spacing between linear lights of the same wavelength incident on the light-deflecting element is therefore not set. However, in reality, the upper limit is set with the mirror size and the degree of speckle noise reduction effect considered. For example, to reduce speckle noise at least by half by use of the mirror of size 15 mm, four light sources are necessary, and the spacing between linear lights of the same wavelength incident on the light-deflecting element can be set up to 5 mm (=15÷(4−1)) at a maximum.

As illustrated in FIG. 23, by reducing speckle noise by a combination of multiple light source wavelength-multiplexing and multiple light source angular multiplexing, on the VCSEL chip 11 the pitch between the light-emitting elements A with different wavelengths can be shortened from X-μm pitch. The integration density of the light-emitting elements A arranged on the VCSEL chip 11 is therefore improved, compared with obtaining the same speckle noise reduction effect by the multiple light source angular multiplexing alone. Owing to the improved integration density, increase in light quantity and the speckle noise reduction effect can be attainable. With the improved integration density, the VCSEL can be further reduced in chip size at the same speckle contrast, leading to further increasing light quantity and reducing speckle noise in the same area.

Figure 25:
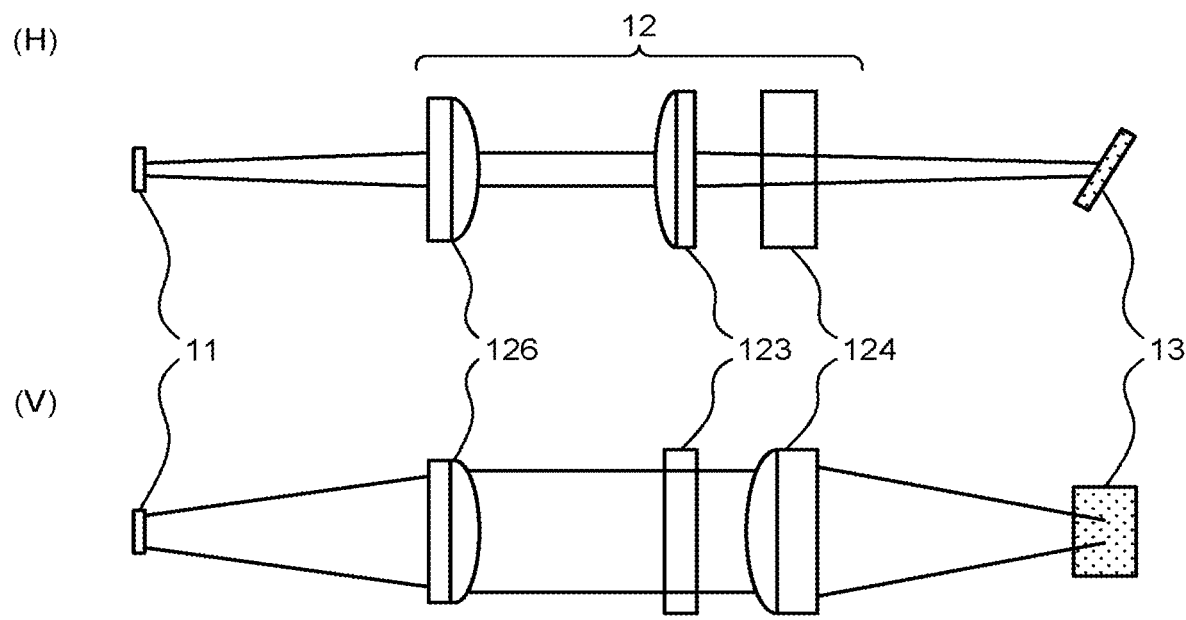
FIG. 25 is a diagram illustrating another exemplary optical system of the optical device.

FIG. 25 is a diagram illustrating another exemplary optical system of the optical device 10. FIG. 25 illustrates an exemplary lens arrangement of the line generator 12 including a spherical lens 126 and two cylindrical lenses (cylindrical lens 123, cylindrical lens 124). In FIG. 22, light diverging from the VCSEL chip 11 is turned into a parallel beam or a substantially parallel beam by different cylindrical lenses 121 and 122 in the horizontal direction (H) and the vertical direction (V), whereas in FIG. 25, one spherical lens 126 is used. Thus, the use of a spherical lens can reduce the number of lenses.

Figure 26:
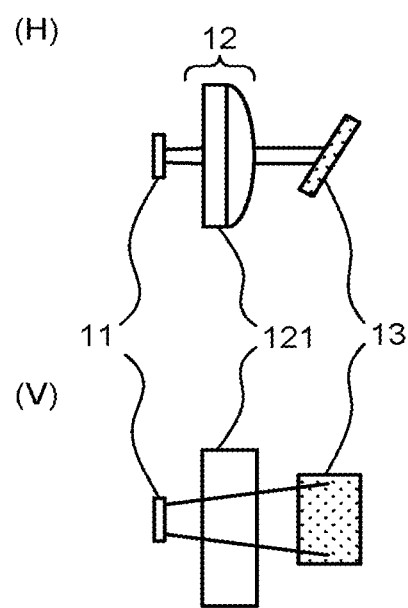
FIG. 26 is a diagram illustrating another exemplary optical system of the optical device.

FIG. 26 is a diagram illustrating another exemplary optical system of the optical device 10. FIG. 26 illustrates an exemplary lens arrangement of the line generator 12 including a cylindrical lens 121. In the horizontal direction (H), light diverging from the VCSEL chip 11 is formed into the width of a linear light by the cylindrical lens 121. In the vertical direction (V), the length of linear light is formed only with light diverging from the VCSEL chip 11. This configuration requires only one lens and therefore can minimize the number of necessary lenses.

Figure 27:
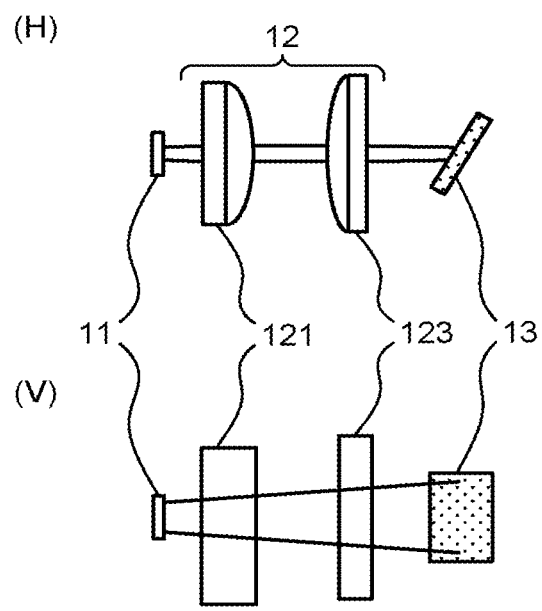
FIG. 27 is a diagram illustrating another exemplary optical system of the optical device.

FIG. 27 is a diagram illustrating another exemplary optical system of the optical device 10. FIG. 27 illustrates an exemplary lens arrangement of the line generator 12 including two cylindrical lenses (cylindrical lens 121, cylindrical lens 123).

In the horizontal direction (H), light diverging from the VCSEL chip 11 is formed into a parallel beam or a substantially parallel beam by the cylindrical lens 121, and the cylindrical lens 123 forms a linear light width in the widthwise direction. In the vertical direction (V), the linear light length in the lengthwise direction is formed only with light diverging from the VCSEL chip 11.

Figure 28:
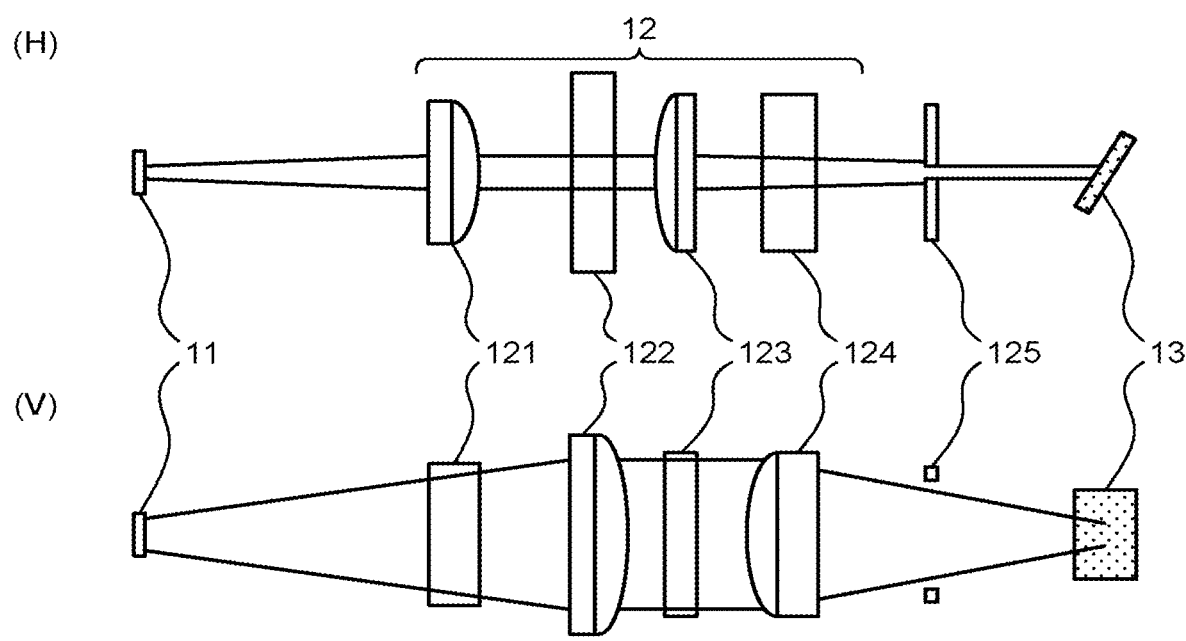
FIG. 28 is a diagram illustrating another exemplary optical system of the optical device.

FIG. 28 is a diagram illustrating another exemplary optical system of the optical device 10. In FIG. 28, a diaphragm 125 is added to the lens arrangement illustrated in FIG. 22. The diaphragm 125 is inserted when light is not sufficiently condensed to the light-deflecting element 13 in the lens arrangement illustrated in FIG. 22. The diaphragm 125 is not limited thereto. At least one diaphragm 125 is inserted at any position. Although FIG. 28 illustrates the diaphragm 125 in the horizontal direction (H), the diaphragm 125 may be inserted in the vertical direction (V). The diaphragm 125 may be inserted for the purpose of removing stray light.

Figure 29:
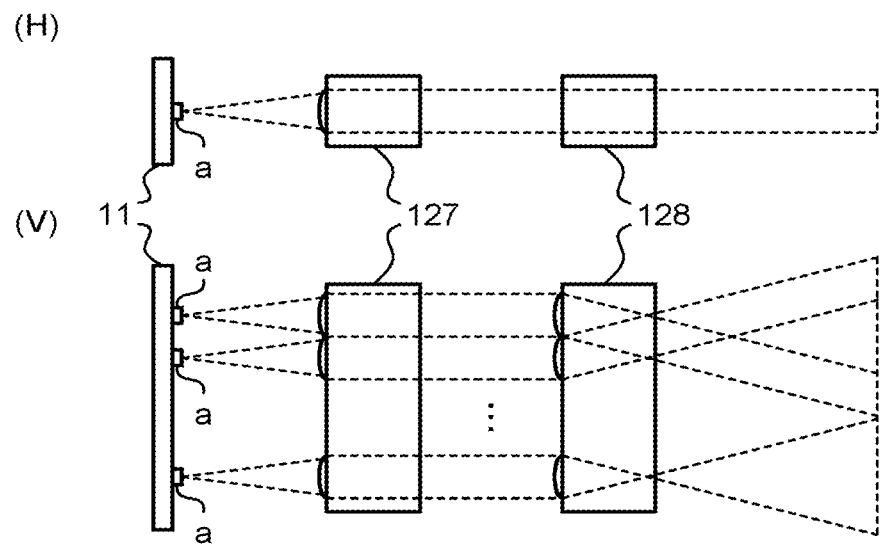
FIG. 29 is a diagram illustrating another exemplary optical system of the optical device.

FIG. 29 is a diagram illustrating another exemplary optical system of the optical device 10. FIG. 29 illustrates that a microlens array 127 and a microcylindrical lens array 128 are inserted before (along optical axis) the VCSEL chip 11 in order to control the divergence angle of each light-emitting element A on the VCSEL chip 11. FIG. 29 omits depicting the arrangement of the stage subsequent to the microcylindrical lens array 128. The divergence angle of each light-emitting element A can be controlled by the microlens array and/or the microcylindrical lens array. That is, the microlens array or the microcylindrical lens array may be used for controlling the divergence angle of each light-emitting element A. The lens arrays may be combined. Herein, an exemplary combination of the lens arrays is described.

Each lens of the microlens array 127 is spherical and converts light diverging from each light-emitting element A on the VCSEL chip 11 into a parallel beam or a substantially parallel beam in horizontal direction (H) and in vertical direction (V). The light beam exiting from the microlens array 127 forms the length of linear light illustrated in the vertical direction (V) by the microcylindrical lens array 128. Thereby, the divergence angle of the VCSEL chip 11 is controlled. Although FIG. 29 illustrates one row of the light-emitting elements A in the horizontal direction, the light-emitting elements A may be arranged in the vertical and horizontal directions in a matrix on the VCSEL. The microlens arrays and the microcylindrical lens arrays may also be formed in a matrix, accordingly.

Light-Deflecting Element

The light-deflecting element 13 is a movable mirror capable of scanning laser light in uniaxial or biaxial direction. Examples of the movable mirror include MEMS mirror, polygon mirror, galvano mirror, and those using any other systems that can scan laser light in uniaxial or biaxial direction. In this example, a movable mirror is used in scanning the object to measure 15 in a scanning range with linear light 14 formed by the line generator 12. The movable mirror performs optical scanning with linear light to form a two-dimensional planar projection pattern.

Figure 30:
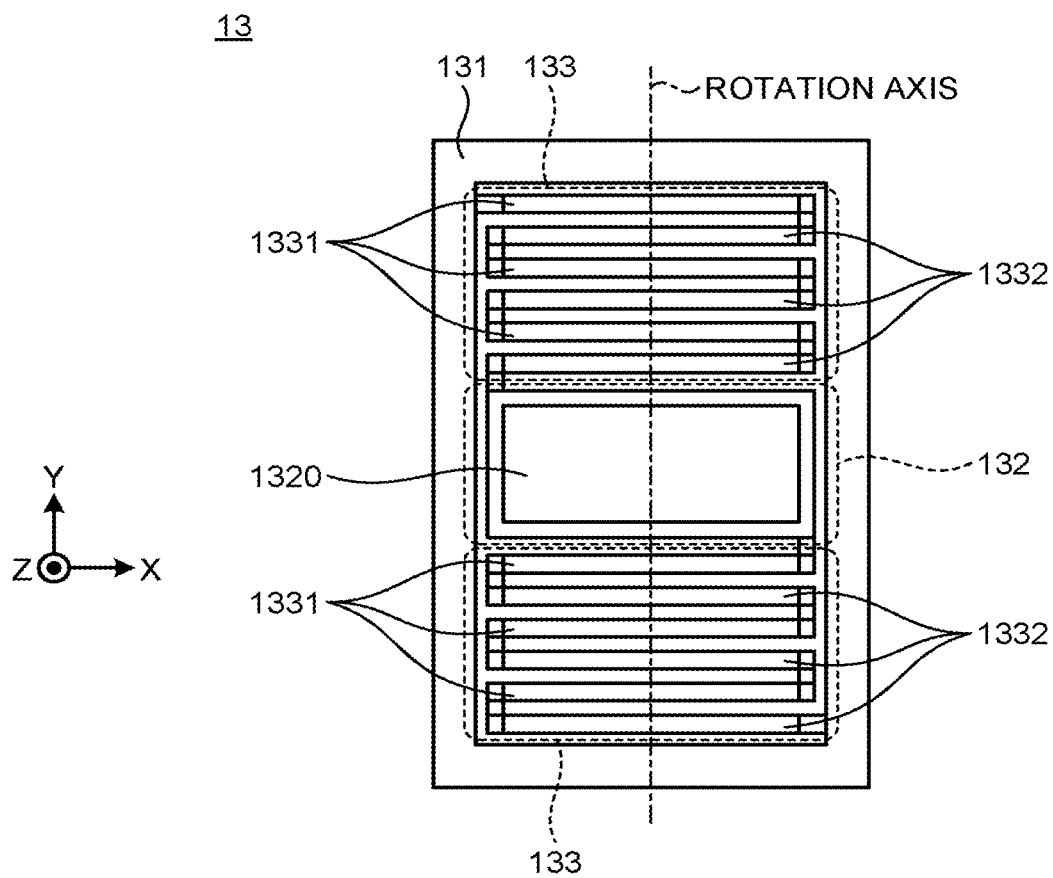
FIG. 30 is an exemplary configuration diagram of a MEMS mirror as an example of the light-deflecting element.

FIG. 30 is an exemplary configuration diagram of a MEMS mirror (also called MEMS mirror scanner) as an exemplary light-deflecting element 13. The MEMS mirror scanner illustrated in FIG. 30 includes a movable part 132 and two serpentine beam parts 133 on a support substrate 131.

The movable part 132 includes a reflective mirror 1320. Each of two serpentine beam parts 133 is coupled at one end to the movable part 132 and supported at the other end by the support substrate 131. The two serpentine beam parts 133 each include a plurality of beams in meander shape. Every other beam of each beam part 133 includes a first piezoelectric member 1331 deformable by application of a first voltage and a second piezoelectric member 1332 deformable by application of a second voltage. The first piezoelectric member 1331 and the second piezoelectric member 1332 are independently included in every adjacent beams. The two serpentine beam parts 133 are deformed by application of a voltage to the first piezoelectric member 1331 and the second piezoelectric member 1332 and rotate the reflective mirror 1320 of the movable part 132 around the rotation axis.

Specifically, voltages of opposite phases are applied to the first piezoelectric member 1331 and the second piezoelectric member 1332 to warp the beams. Thereby, the adjacent beams are accumulatively flexed in different directions so that the reflective mirror 1320 reciprocally rotates around the rotation axis together with the movable part 132 coupled to two serpentine beam parts 133. By applying, to the first piezoelectric member 1331 and the second piezoelectric member 1332, sinusoidal waves in opposite phases with a drive frequency adapted to the mirror resonant mode rotating about the rotation axis, the reflective mirror 1320 can be rotated at an extremely large rotation angle at a low voltage.

The drive waveform is not limited to sinusoidal waves. For example, it may be serrated waves. A non-resonant mode may be employed for driving, rather than the resonant mode.

Figure 31:
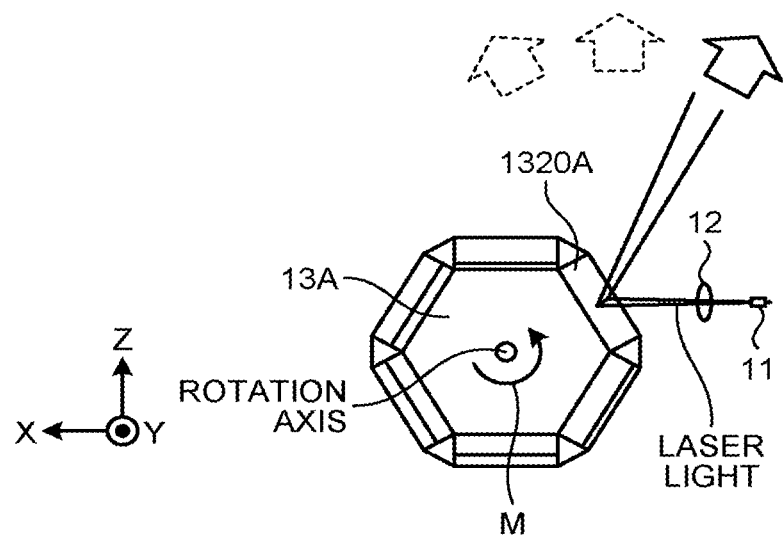
FIG. 31 is an exemplary configuration diagram of a polygon mirror as an example of the light-deflecting element.

FIG. 31 is an exemplary configuration diagram of a polygon mirror as an exemplary light-deflecting element 13. In FIG. 31 the polygon mirror includes a plurality of planar mirrors 1320A attached to a rotor 13A that rotates at constant velocity in M direction around the rotation axis. Linear light is incident on the planar mirror 1320A from the line generator 12 and uniaxially scans an object to measure by changing the angle of the planar mirror 1320A. As indicated by the arrow in FIG. 31, the polygon mirror enables measurement over a wide horizontal (vertical to the Y-axis) area.

In the example illustrated in FIG. 31, the mirror surfaces 1320A of the polygon mirror differ from one another in tilt angle relative to the rotation axis. Thus, the mirror surfaces 1320A with different tilt angles can regulate the vertical exit angle of linear light, so that the vertical output angle varies every time the mirror surfaces 1320A changes by the rotation of the rotor 13A. By setting the mirror surfaces 1320A at different tilt angles, thus, it is made possible to widen the vertical scan range in accordance with the number of the surfaces of the polygon mirror.

Camera

Figure 32:
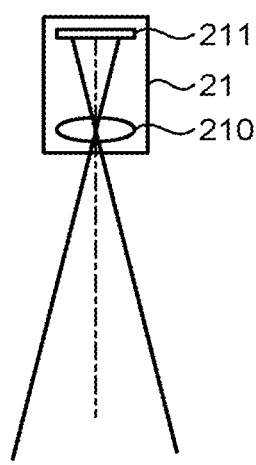
FIG. 32 is an exemplary configuration diagram of a camera.

FIG. 32 is an exemplary configuration diagram of the camera 21. The camera 21 includes a lens 210 and an imager 211. For example, the imager 211 may be a CCD or CMOS image sensor. Light is incident on the camera 21 and imaged on the imager 211 through the lens 210 and is converted into an electrical signal. The electrical signal converted by the imager 211 is converted into an image signal, and the camera 21 outputs the image signal to the arithmetic processor 32 (see FIG. 18) of the control unit (see FIG. 18).

The camera 21 may include, before the lens 210, a filter that transmits a wavelength in the vicinity of the oscillation wavelength of the laser light source. This enables light excluding wavelengths except for the vicinity of oscillation wavelength of the VCSEL chip 11 to be incident on the lens 210, (see FIG. 18), thereby improving S/N ratio.

Functional Blocks of Control Unit

Figure 33:
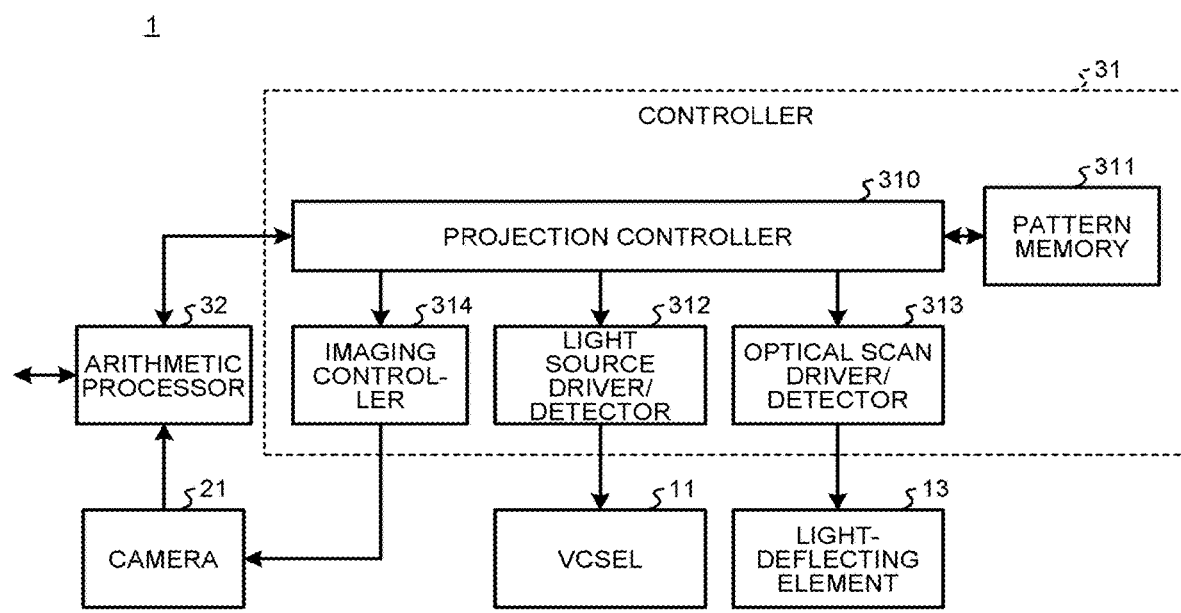
FIG. 33 is an exemplary block configuration diagram of the measuring device.

FIG. 33 is a diagram illustrating an exemplary block configuration of the measuring device 1. In FIG. 33, the elements already described are denoted by the same reference signs and will not be further elaborated.

The arithmetic processor 32 illustrated in FIG. 33 analyzes an image signal output from the camera 21. The arithmetic processor 32 reconstructs three-dimensional information through computation based on the analysis result of the image signal and calibration information to three-dimensionally measure an object. The arithmetic processor 32 supplies the reconstructed three-dimensional information to the controller 31.

The controller 31 includes a projection controller 310, a pattern memory 311, a light source driver/detector 312, an optical scan driver/detector 313, and an imaging controller 314.

The optical scan driver/detector 313 drives the light-deflecting element 13 under the control of the projection controller 310. The projection controller 310 controls the optical scan driver/detector 313 such that linear light radiating the deflection center of the light-deflecting element 13 scans an object to measure. The imaging controller 314 controls the imaging timing and the exposure quantity of the camera 21 under the control of the projection controller 310.

The light source driver/detector 312 controls turning-on and turning-off of the light-emitting elements of the VCSEL chip 11 under the control of the projection controller 310. The light source driver/detector 312 includes a feedback control circuit. A part or the whole of the feedback control circuit may be mounted on the VCSEL chip 11.

The pattern memory 311 reads, for example, pattern information of a projection image from a nonvolatile storage medium of the measuring device 1. The pattern information is for forming a projection image (projection pattern). The pattern memory 311 reads pattern information and passes the read pattern information to the projection controller 310 in accordance with an instruction from the projection controller 310. The projection controller 310 controls the light source driver/detector 312 based on the pattern information from the pattern memory 311.

The projection controller 310 may instruct the pattern memory 311 to read pattern information based on the reconstructed three-dimensional information supplied from the arithmetic processor 32 and may give the arithmetic processor 32 an instruction for a computation method in accordance with the read pattern information.

The arithmetic processor 32, the projection controller 310, and the imaging controller 314 are implemented by a measurement program running on a central processing unit (CPU). The CPU reads and executes the measurement program from a read only memory (ROM) to implement the arithmetic processor 32, the projection controller 310, and the imaging controller 314. The implementation method is illustrated only by way of example and is not limited thereto. For example, a part or the whole of the arithmetic processor 32, the projection controller 310, and the imaging controller 314 may be configured with hardware circuitry operating in cooperation with each other. In addition to the arithmetic processor 32, the projection controller 310, and the imaging controller 314, any other blocks may also be implemented by a measurement program.

Projection Pattern

Projection pattern for scanning an object to measure will now be described. There are several three-dimensional measurement methods for acquiring the shape and attitude of an object as three-dimensional information by observing light irradiating the object. Two examples of such measurement methods will be described: (1) measurement by phase shifting and (2) measurement by light sectioning. These measurement methods are disclosed, for example, in the following non-patent literatures:

(1) Precision improvement method for phase shifting based projector-camera stereo system using response function "Meeting on Image Recognition and Understanding 2009 (MIRU2009)"

(2) "Three Dimensional Visual Inspection Technology Based on Light-Section Method" RICOH TECHNICAL REPORT, No. 39, 2013, issued on Jan. 28, 2014

Figure 34:
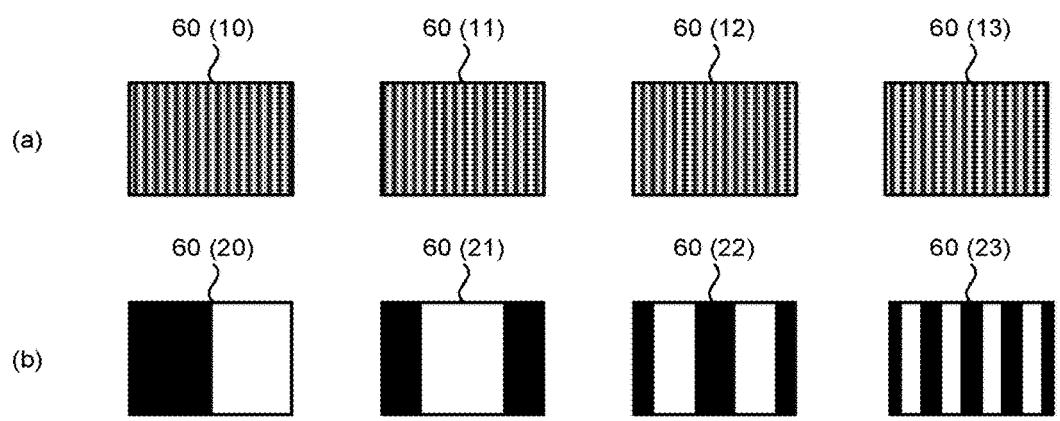
FIG. 34 illustrates measuring by phase shifting.

First, the measurement by (1) phase shifting is described briefly. In phase shifting, three-dimensional shape and attitude is reconstructed by phase analysis of projection patterns 60(10), 60(11), 60(12), and 60(13), which are phase shift patterns with different phases illustrated in FIG. 34(a). By additional use of space coding of projection patterns 60(20), 60(21), 60(22), and 60(23) being different gray code patterns illustrated in FIG. 34(b) to implement phase unwrapping in accordance with the results of the phase coding and phase shifting, three-dimensional shape and attitude can be reconstructed accurately.

Thereby, in the measurement by (1) phase shifting, the projection patterns 60(10) to 60(13) and 60(20) to 60(23) are individually imaged.

Figure 35:
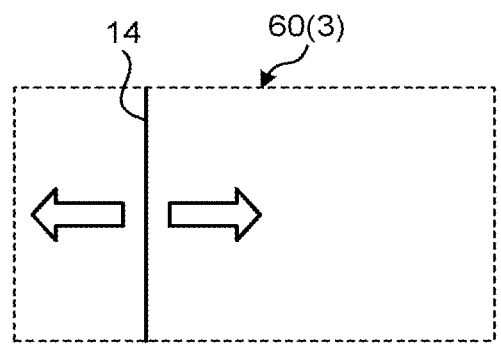
FIG. 35 illustrates measuring by light sectioning.

Next, the measurement by (2) light sectioning is described briefly. In light sectioning, a linear light source irradiates an object to measure with an emission line, and generates an image of the object irradiated with the emission line to obtain an emission-line image. For example, as illustrated in FIG. 35, linear light (emission line) 14 is generated from the light-deflecting element. A three-dimensional shape of one line of the object to measure is formed from the emission-line image. As illustrated in the projection pattern 60(3) in FIG. 35, the light-deflecting element changes the irradiation position of the linear light 14 in the direction of the arrow to generate a plurality of emission-line images of the object to measure. A three-dimensional shape of the entire object to measure can be thus generated. Light sectioning using line section patterns is suitable for measuring glossy objects.

Effects of Example

In this example, with the use of the VCSEL chip 11, the quantity of output light of the light-emitting elements A is stabilized and the light-emitting elements A can produce the same level output. Accordingly, in three-dimensional measurement for projecting phase patterns with periodically changing brightness values, not only the effect of speckle noise but also unevenness in output of the light sources can be reduced, and a phase pattern as designed can be projected. Stable and accurate measurement thus can be implemented.

Third Embodiment

A third embodiment will now be described. The third embodiment is an example that the measuring device 1 according to the second embodiment is combined with a robot arm (multi-jointed arm).

Figure 36:
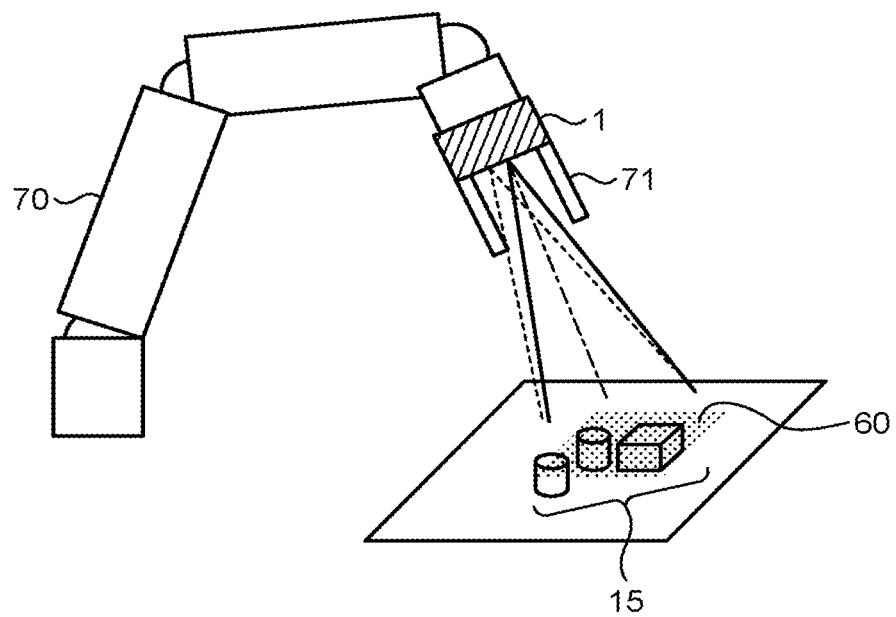
FIG. 36 is an exemplary configuration diagram of a robot according to a third embodiment.

FIG. 36 is an exemplary configuration diagram of a robot according to the third embodiment. FIG. 36 illustrates that the measuring device 1 is applied to a robot arm with multiple joints, as an example. A robot arm 70 includes a hand 71 for picking an object, and the measuring device 1 adjacent to the hand 71. The robot arm 70 includes a plurality of flexible, movable parts and changes the position and orientation of the hand 71 in accordance with the control.

The measuring device 1 is set such that light projection direction matches the direction in which the hand 71 faces, and measures an object 15 to pick by the hand 71 as a target.

Thus, in the third embodiment, the robot arm 70 incorporates the measuring device 1 to able to measure an object to pick in a close distance, and improve measurement accuracy and recognition accuracy, compared with measurement at a far distance by a camera, for example. For example, in the field of factory automation (FA) such as assembly lines in factories, robots such as the robot arm 70 are used for inspection and recognition of parts and components. The robot including the measuring device 1 can accurately inspect and recognize parts and components.

The third embodiment describes the measuring device 1 included in the robot arm 70, however, the robot arm 70 may include the functions of the measuring device 1. More specifically, part of the measuring device 1 such as hardware may be communalized and incorporated into the robot arm 70.

Fourth Embodiment

A fourth embodiment will now be described. The fourth embodiment is an example that the measuring device 1 according to the second embodiment is mounted on an electronic apparatus such as a smartphone and a PC.

Figure 37:
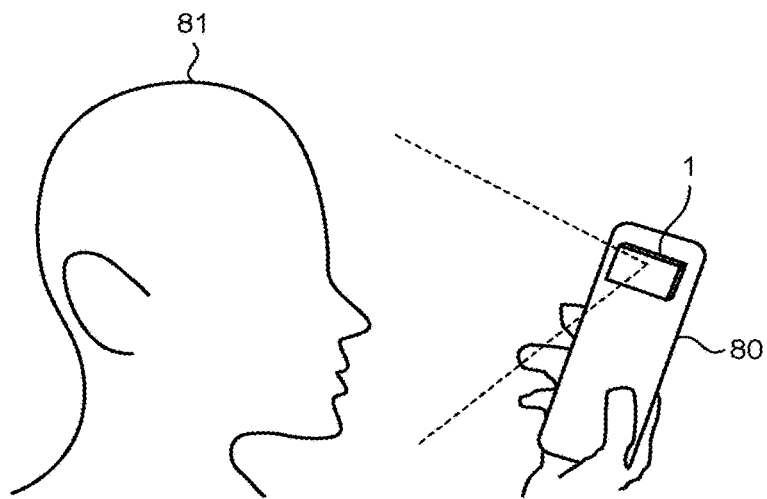
FIG. 37 is an exemplary configuration diagram of an electronic device, such as a smartphone, according to a fourth embodiment.

FIG. 37 is an exemplary configuration diagram of an electronic device such as a smartphone according to the fourth embodiment. FIG. 37 illustrates an example of the measuring device 1 applied to a smartphone 80. The smartphone 80 is equipped with the measuring device 1 and a user authentication function. The smartphone 80 incorporates the user authentication function by, for example, dedicated hardware. This function may be implemented by a CPU of a computer configuration executing a computer program in a ROM, for example. The measuring device 1 measures the shapes of the face, ear, and head of a user 81. Based on this measurement result, the user authentication function determines whether the user 81 is a person registered in the smartphone 80.

Thus, in the fourth embodiment, the smartphone 80 incorporating the measuring device 1 can accurately measure the shapes of the face, ear, and head of the user 81 and improve recognition accuracy. Although this example illustrates the measuring device 1 included in the smartphone 80, the measuring device 1 may be mounted on an electronic apparatus such as a PC and a printer. In terms of the functional aspect, the measuring device 1 may be used for a scanner for facial shapes, rather than the personal authentication function.

Although the fourth embodiment describes the measuring device 1 included in the smartphone 80, the smartphone 80 may include the functions of the measuring device 1. More specifically, part of the measuring device 1 such as hardware may be communalized and incorporated into the smartphone 80.

Fifth Embodiment

A fifth embodiment will now be described. The fifth embodiment describes an example of mounting the measuring device 1 according to the second embodiment on a movable structure.

Figure 38:
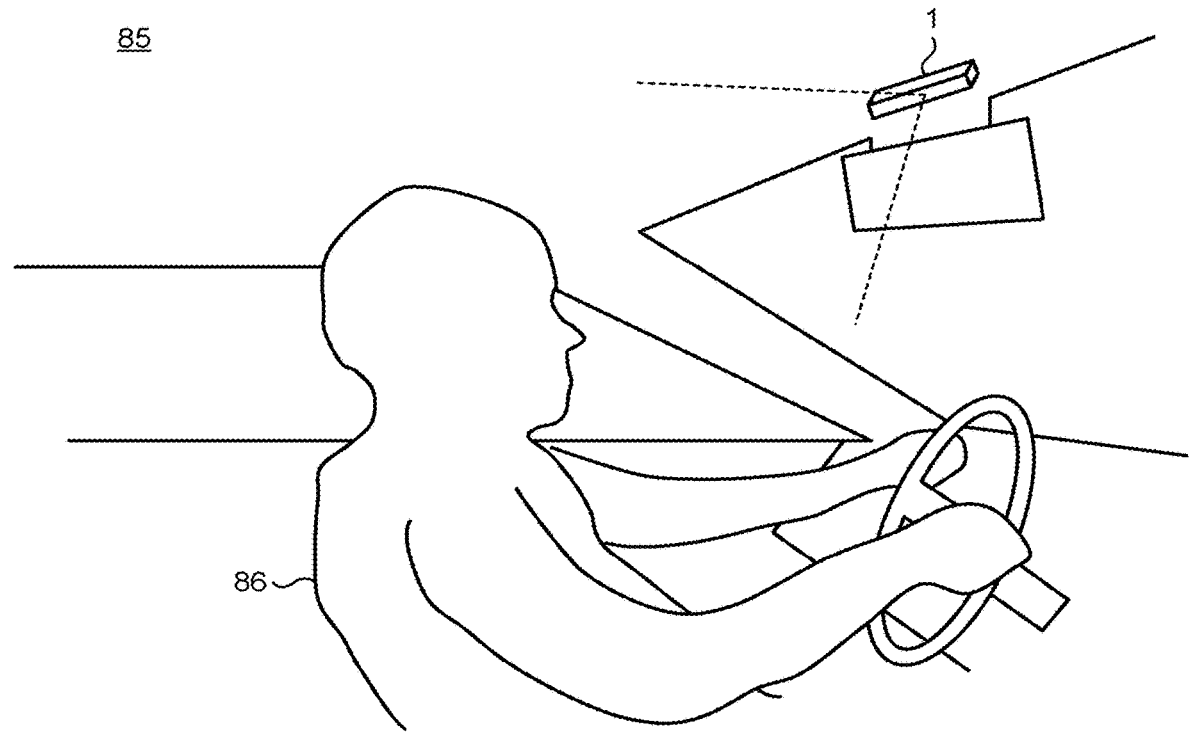
FIG. 38 is an exemplary configuration diagram of a vehicle according to a fifth embodiment.

FIG. 38 is an exemplary configuration diagram of a vehicle according to the fifth embodiment, illustrating the measuring device 1 applied to an automobile by way of example. A vehicle 85 incorporates the measuring device 1 and a driver assistance function in the interior. The vehicle 85 includes dedicated hardware for driver assistance function, for example. This function may be implemented by a CPU of a computer executing a computer program in a ROM, for example. The measuring device 1 measures, for example, the face and posture of a driver 86. Based on a result of the measurement, the driver assistance function serves to provide appropriate assistance to the driver 86 in accordance with his or her situation.

Thus, in the fifth embodiment, the measuring device 1 incorporated in an automobile can accurately measure the face, posture, and else of the driver 86, and improve the accuracy of recognizing the state of the driver 86 inside the vehicle 85. Although this example describes the measuring device 1 mounted on an automobile, it may be mounted in the interior of a train, and the cockpit or passenger seat of an airplane, for example. In terms of functional aspects, the measuring device 1 may be used for recognition of a passenger other than the driver 86 or the state of the vehicle interior 85 in addition to the state of the driver 86, such as the face and posture of the driver 86. It may be used for vehicle security, including personal authentication of the driver 86 and determination on whether the driver 86 is a person pre-registered as the driver of the vehicle.

Figure 39:
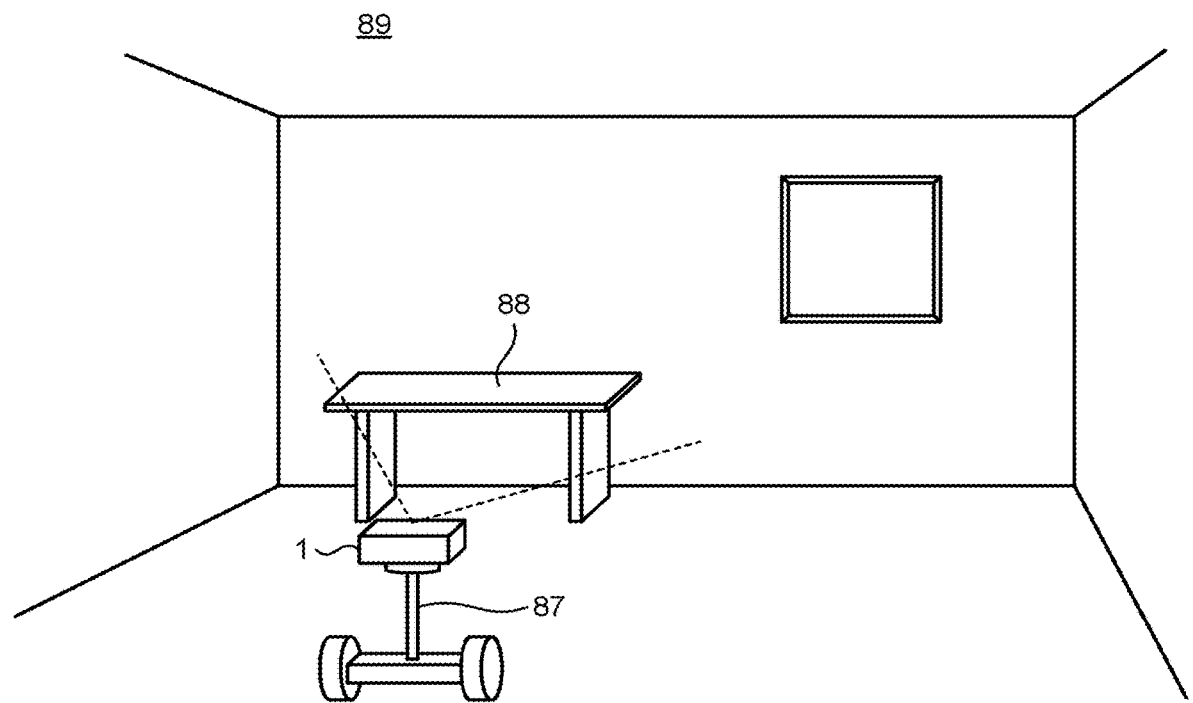
FIG. 39 is an exemplary configuration diagram of another movable structure according to the fifth embodiment.

FIG. 39 is an exemplary configuration diagram of another movable structure according to the fifth embodiment. FIG. 39 illustrates the measuring device 1 to an autonomous movable structure by way of example. A movable structure 87 incorporates the measuring device 1 to measure the surroundings of the movable structure 87. From a result of the measurement, the movable structure 87 determines a moving path and calculates the layout of room interior 89 such as the position of a desk 88.

Thus, in the fifth embodiment, the movable structure 87 includes the measuring device 1 to be able to accurately measure the surroundings of the movable structure 87, and provide assistance in driving the movable structure 87. Although this example describes the measuring device 1 mounted on a small-size movable structure 87, it may be mounted on an automobile, for example. It may be used not only indoors but also outdoors and may be used for measurement of buildings.

The fifth embodiment describes the measuring device 1 included in the movable structure 87 such as automobile, however, the movable structure 87 may include the functions of the measuring device 1. More specifically, part of the measuring device 1 such as hardware may be communalized and incorporated into the movable structure 87.

Sixth Embodiment

A sixth embodiment will now be described. The sixth embodiment describes an example of mounting the measuring device 1 according to the second embodiment on a manufacturing apparatus.

Figure 40:
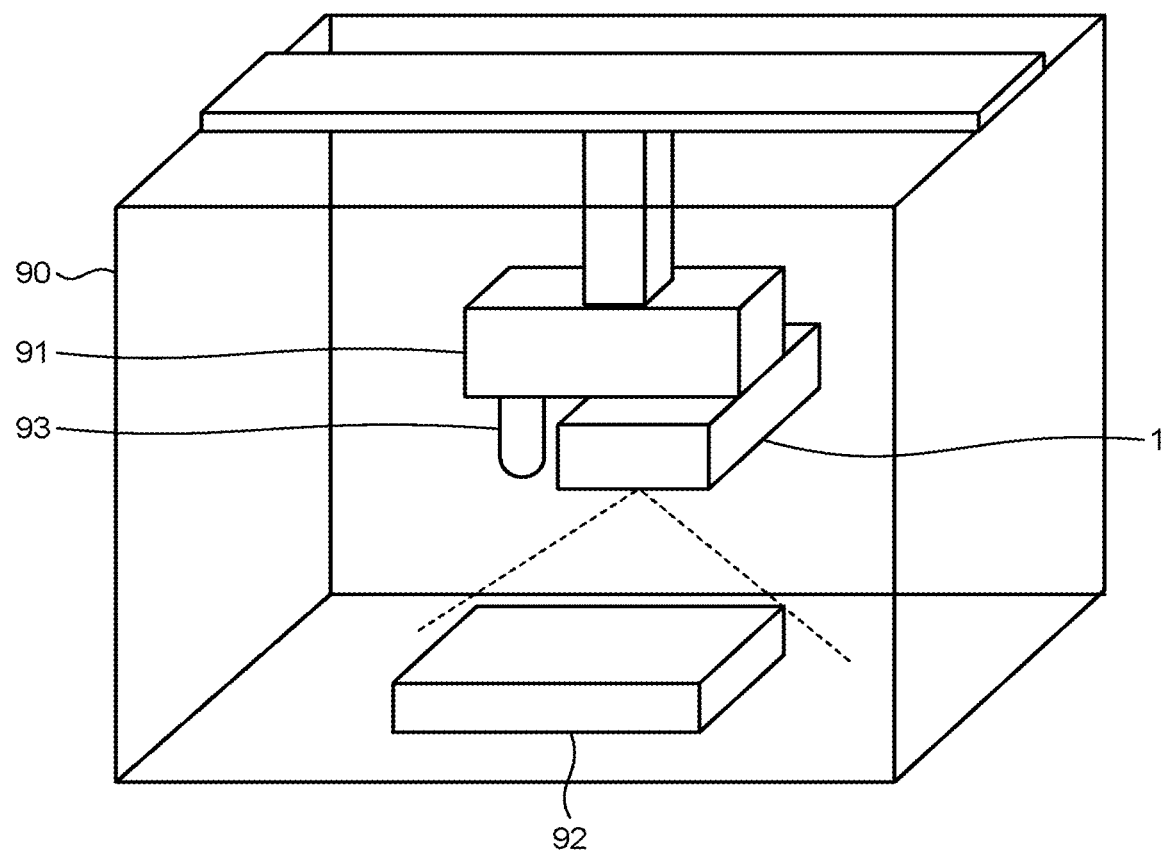
FIG. 40 is an exemplary configuration diagram of a three-dimensional (3D) printer according to a sixth embodiment.

FIG. 40 is an exemplary configuration diagram of a manufacturing apparatus according to the sixth embodiment. FIG. 40 illustrates the measuring device 1 applied to a head 91 of a 3D printer 90 as an exemplary manufacturing apparatus. The head 91 includes a nozzle 93 that ejects a liquid for forming an object 92. The measuring device 1 measures the shape of the object 92 during manufacturing by the 3D printer 90. The 3D printer 90 is controlled to form the object 92 on the basis of a result of the measurement.

Thus, in the sixth embodiment, the 3D printer 90 including the measuring device 1 can measure the shape of the object 92 during manufacturing and accurately form the object 92. This example illustrates the measuring device 1 attached to the head 91 of the 3D printer 90, however, it may be attached to another location of the 3D printer 90.

The sixth embodiment describes the measuring device 1 included in the 3D printer 90. However, the 3D printer 90 may include the functions of the measuring device 1. More specifically, part of the measuring device 1 such as hardware may be communalized and incorporated into the 3D printer 90.

The present invention exerts an advantageous effect of reducing difference in average brightness of speckle patterns.

The above-described embodiments are illustrative and do not limit the present invention. Thus, numerous additional modifications and variations are possible in light of the above teachings. For example, at least one element of different illustrative and exemplary embodiments herein may be combined with each other or substituted for each other within the scope of this disclosure and appended claims. Further, features of components of the embodiments, such as the number, the position, and the shape are not limited the embodiments and thus may be preferably set. It is therefore to be understood that within the scope of the appended claims, the disclosure of the present invention may be practiced otherwise than as specifically described herein.

Further, as described above, any one of the above-described and other methods of the present invention may be embodied in the form of a computer program stored in any kind of storage medium. Examples of storage mediums include, but are not limited to, flexible disk, hard disk, optical discs, magneto-optical discs, magnetic tapes, non-volatile memory, semiconductor memory, read-only-memory (ROM), etc.

Each of the functions of the described embodiments may be implemented by one or more processing circuits or circuitry. Processing circuitry includes a programmed processor, as a processor includes circuitry. A processing circuit also includes devices such as an application specific integrated circuit (ASIC), digital signal processor (DSP), field programmable gate array (FPGA) and conventional circuit components arranged to perform the recited functions.

What is claimed is:

1. A light source comprising:
a plurality of light-emitting elements each comprising one or more surface-emitting lasers; and
one or more detecting elements located on a same substrate as the light-emitting elements, the one or more detecting elements to detect quantities of output light of the light-emitting elements,
the light-emitting elements and the one or more detecting elements include a waveguide formed on the same substrate,
wherein:
the waveguide is to guide light from the light-emitting elements to the one or more detecting elements,
the one or more detecting elements receive light from the light-emitting elements through the waveguide, and
a region which the waveguide is absent from exists in-between the light-emitting elements and the one or more detecting elements.

2. The light source according to claim 1, wherein:
the light-emitting elements comprise the one or more detecting elements one for one, the one or more detecting elements to receive light from the corresponding light-emitting elements.

3. The light source according to claim 1, further comprising:
a plurality of light-emitting elements with different oscillation wavelengths.

4. The light source according to claim 3, wherein:
the light-emitting elements includes a plurality of light-emitting elements with a same wavelength.

5. The light source according to claim 4, wherein:
among the light-emitting elements, the light-emitting elements with different wavelengths are arranged with narrower spacing than the light-emitting elements with the same wavelength.

6. The light source according to claim 5, wherein:
the light-emitting elements with the respective wavelengths are arranged with the same spacing.

7. A light source device comprising:
the light source according to claim 1; and
a controller configured to receive output from the one or more detecting elements to control the light-emitting elements.

8. The light source device according to claim 7, wherein:
the controller
converts a quantity of light received by the one or more detecting elements into an electrical signal, and
feeds back a control signal to the light-emitting elements in accordance with the electrical signal, the control signal serving to regulate output light of the light-emitting elements to a given quantity.

9. An optical device comprising:
the light source according to claim 7; and
a projector to project light from the light-emitting elements onto an intended surface.

10. A measuring device comprising:
the optical device according to claim 9; and
an imager to image linear light irradiating the surface; and
measuring circuitry configured to measure an object on the surface on the basis of image information of the linear light imaged by the imager.

11. A robot comprising:
a multi-jointed arm equipped with the measuring device according to claim 10.

12. An electronic apparatus comprising:
the measuring device according to claim 10; and
an authenticator to authenticate a user on the basis of a measurement of the user by the measuring device.

13. A movable structure comprising:
the measuring device according to claim 10; and
a driving assist to provide assistance for driving the movable structure on the basis of a result of measurement by the measuring device.

14. A manufacturing apparatus comprising:
the measuring device according to claim 10; and
a head to form an object on the basis of a result of measurement by the measuring device.

15. The light source according to claim 1, wherein:
the waveguide includes an active layer of the plurality of light-emitting elements and a same configuration.

* * * * *